United States Patent
Nelson et al.

(10) Patent No.: US 9,897,661 B2
(45) Date of Patent: Feb. 20, 2018

(54) AUTOMATICALLY DETERMINING A NUMBER OF FUNCTIONING BATTERIES

(71) Applicant: Microsoft Technology Licensing, LLC, Redmond, WA (US)

(72) Inventors: David T. Nelson, Duvall, WA (US); Da Hai Hu, Redmond, WA (US); Hamid Shayesteh-Pour, Woodinville, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 227 days.

(21) Appl. No.: 14/659,992

(22) Filed: Mar. 17, 2015

(65) Prior Publication Data
US 2016/0274194 A1 Sep. 22, 2016

(51) Int. Cl.
*H02J 7/00* (2006.01)
*G01R 31/36* (2006.01)

(52) U.S. Cl.
CPC ....... *G01R 31/3658* (2013.01); *G01R 31/362* (2013.01); *H02J 7/008* (2013.01); *H02J 7/0021* (2013.01); *G01R 31/3648* (2013.01); *H02J 7/0047* (2013.01)

(58) Field of Classification Search
CPC ................................................ G01R 31/3658
USPC ....................................................... 324/434
See application file for complete search history.

(56) References Cited

U.S. PATENT DOCUMENTS

| | | |
|---|---|---|
| 5,572,136 A | 11/1996 | Champlin |
| 5,592,093 A | 1/1997 | Klingbiel |
| 6,906,523 B2 | 6/2005 | Bertness et al. |
| 7,003,410 B2 | 2/2006 | Bertness et al. |
| 7,081,755 B2 | 7/2006 | Klang et al. |
| 7,348,763 B1 | 3/2008 | Reinhart et al. |
| 8,237,448 B2 | 8/2012 | Bertness et al. |
| 8,306,690 B2 | 11/2012 | Bertness et al. |
| 8,604,748 B2 | 12/2013 | Littow |
| 8,738,310 B2 | 5/2014 | Swanton |

(Continued)

FOREIGN PATENT DOCUMENTS

EP         2209178 A1      7/2010

OTHER PUBLICATIONS

"International Preliminary Report on Patentability Issued in PCT Application No. PCT/US2016/021639", dated Sep. 9, 2016, 5 Pages.

(Continued)

*Primary Examiner* — Arun Williams
(74) *Attorney, Agent, or Firm* — Fiala & Weaver P.L.L.C.

(57) ABSTRACT

Systems, methods and computer program products are described herein that can automatically determine the number of functional rechargeable batteries within an electronic device that includes a plurality of rechargeable batteries without having to open up the electronic device to inspect the batteries. In an embodiment, an external computing device or the electronic device itself determines a measure of impedance associated with the plurality of rechargeable batteries based on a first voltage level of the plurality of rechargeable batteries obtained during a discharging state thereof and a second voltage level of the plurality of rechargeable batteries obtained during a charging state thereof and then determines the number of operational rechargeable batteries within the plurality of rechargeable batteries based on the measure of impedance.

20 Claims, 11 Drawing Sheets

(56) References Cited

U.S. PATENT DOCUMENTS

| | | | |
|---|---|---|---|
| 2003/0030442 A1* | 2/2003 | Sugimoto | G01R 31/3658 324/429 |
| 2003/0057918 A1* | 3/2003 | Aoki | G01R 31/3624 320/136 |
| 2005/0075806 A1 | 4/2005 | Phansalkar et al. | |
| 2005/0218902 A1 | 10/2005 | Restaino et al. | |
| 2008/0111521 A1* | 5/2008 | So | H01M 10/44 320/137 |
| 2012/0143541 A1 | 6/2012 | Wu et al. | |
| 2012/0200266 A1 | 8/2012 | Berkowitz et al. | |
| 2012/0319653 A1 | 12/2012 | Kumar et al. | |
| 2013/0026828 A1* | 1/2013 | Iwami | G01R 31/3679 307/10.1 |
| 2013/0063080 A1* | 3/2013 | Shiraishi | H02J 7/0014 320/107 |
| 2013/0113432 A1* | 5/2013 | Suzuki | H02J 7/0014 320/134 |
| 2015/0369876 A1* | 12/2015 | Kobayashi | H01M 10/482 29/593 |

OTHER PUBLICATIONS

"International Search Report and Written Opinion Issued in PCT Application No. PCT/US2016/021639", dated Jun. 13, 2016, 11 Pages.
"Apple Diagnostics: Reference codes", Published on: Jun. 22, 2013, Available at: http://support.apple.com/kb/TS4575, 5 pages.
"Rechargeable Battery Testing with the NI PXI-4130 Power SMU", In White Papers, Jul. 6, 2012, 2 pages.

* cited by examiner

AUTOMATICALLY DETERMINING A NUMBER OF FUNCTIONING BATTERIES

BACKGROUND

A vastly increasing number of electronic devices are being manufactured that are powered by rechargeable batteries. For example, a wide variety of smart phones, tablet computers, personal media players, cameras, handheld game consoles, video game controllers, wearable devices (e.g., wearable fitness devices), and Internet of Things devices are being manufactured that include embedded rechargeable batteries. A common design goal for many of these devices is to increase the amount of functionality included within the device while maintaining or even reducing the overall device size. This can make it difficult to find space within the device housing to accommodate a rechargeable battery. One way of addressing this issue is to replace a single rechargeable battery with multiple smaller rechargeable batteries that can be arranged in configurations that could not be achieved using the larger rechargeable battery. Designers may also opt to use multiple rechargeable batteries to provide redundant power sources within a device.

SUMMARY

Systems, methods and computer program products are described herein that can automatically determine the number of functional rechargeable batteries within an electronic device that includes a plurality of rechargeable batteries.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Moreover, it is noted that the claimed subject matter is not limited to the specific embodiments described in the Detailed Description and/or other sections of this document. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate embodiments of the application and, together with the description, further serve to explain the principles of the embodiment and to enable a person skilled in the relevant art(s) to make and use the embodiments.

Figure 11:
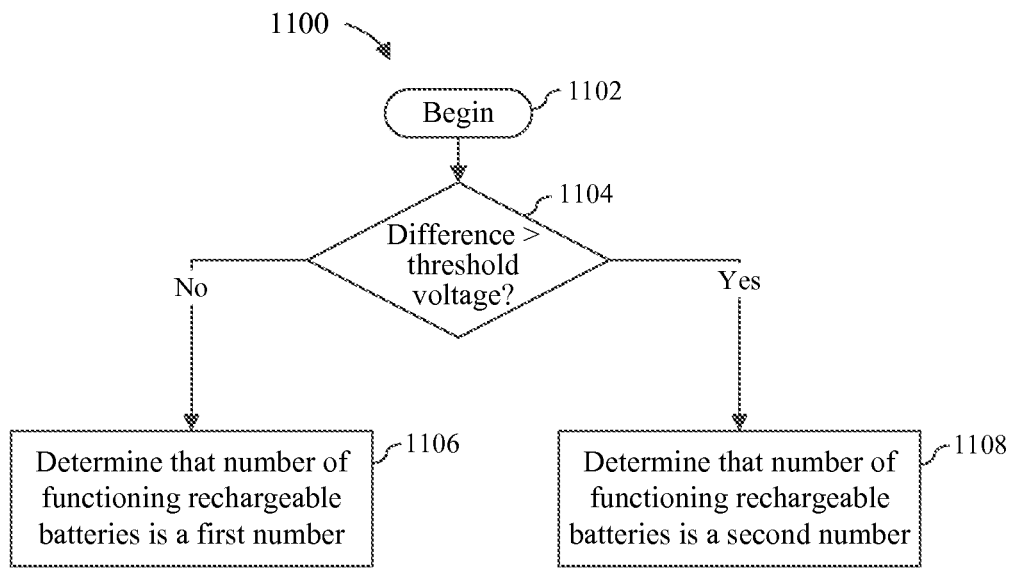

FIG. 11 depicts a flowchart of a method for automatically determining how many of a plurality of rechargeable batteries included within an electronic device are functioning based on a difference between a second voltage level of the plurality of rechargeable batteries determined while charging of the plurality of rechargeable batteries by a power source is enabled and a first voltage level of the plurality of rechargeable batteries determined while charging of the plurality of rechargeable batteries by the power source is disabled.

Figure 12:
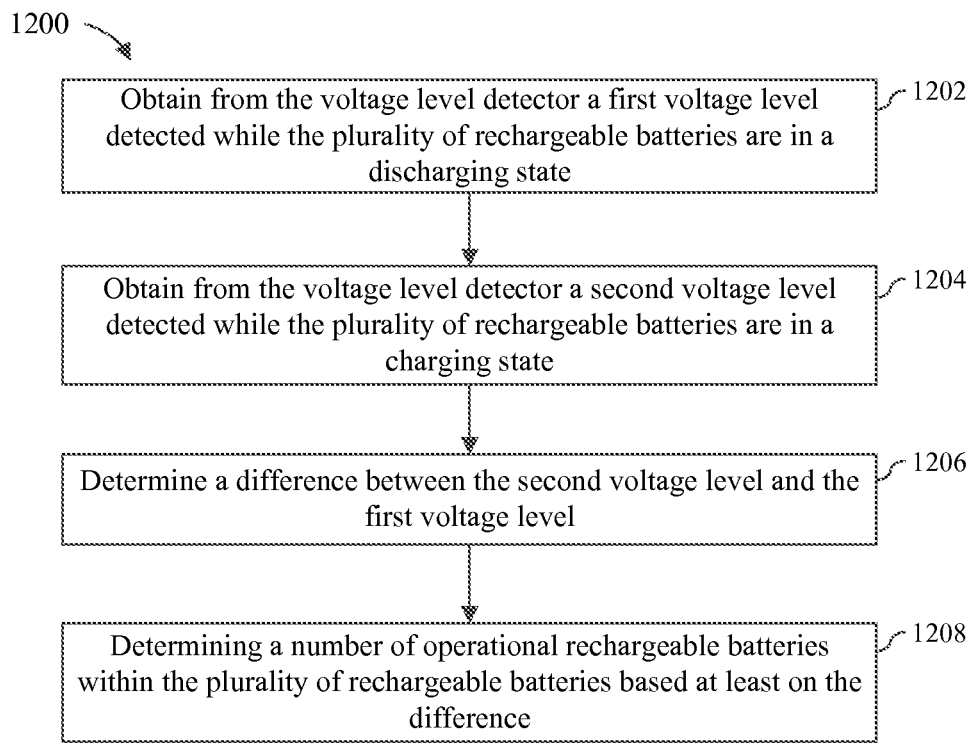

FIG. 12 depicts a flowchart of a method for automatically determining a number of functioning rechargeable batteries within a device that includes a plurality of rechargeable batteries.

Figure 13:
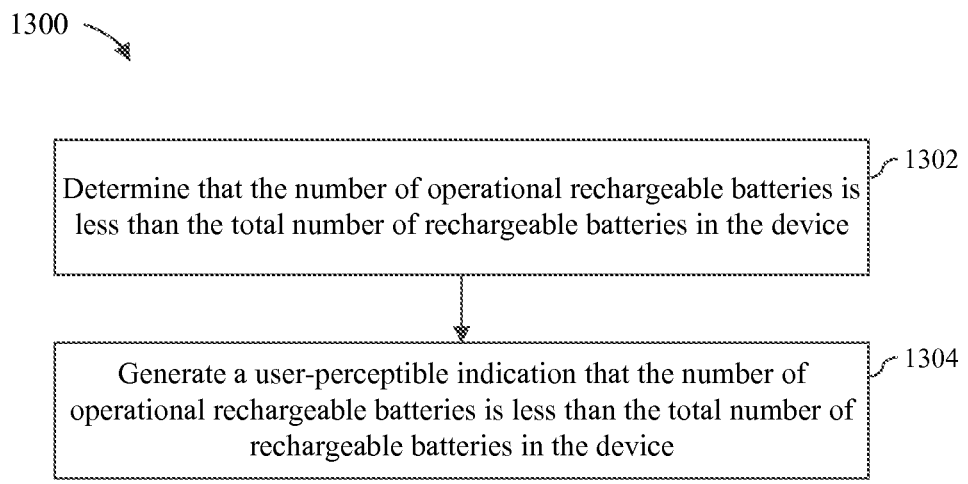

FIG. 13 depicts a flowchart of a method performed by an electronic device for responding to a determination that not all of the rechargeable batteries within the electronic device are functioning.

Figure 14:
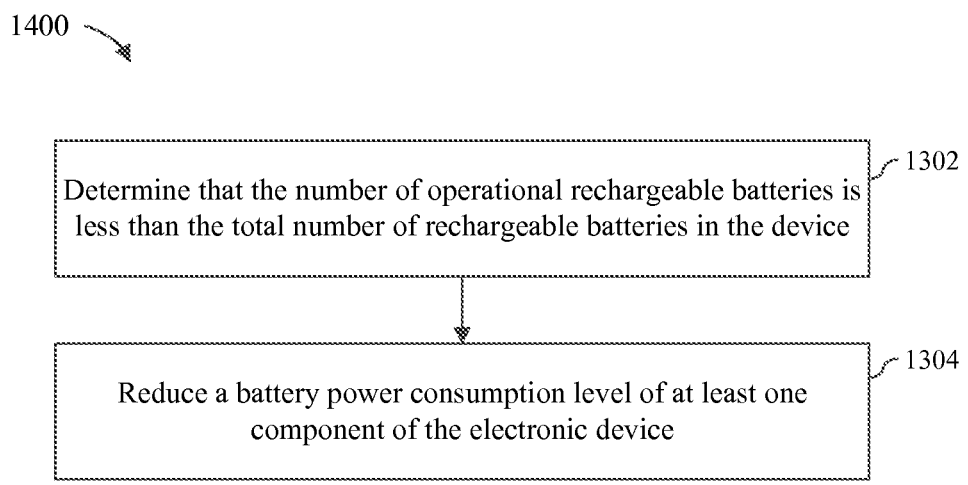

FIG. 14 depicts a flowchart of another method performed by an electronic device for responding to a determination that not all of the rechargeable batteries within the electronic device are functioning.

Figure 15:
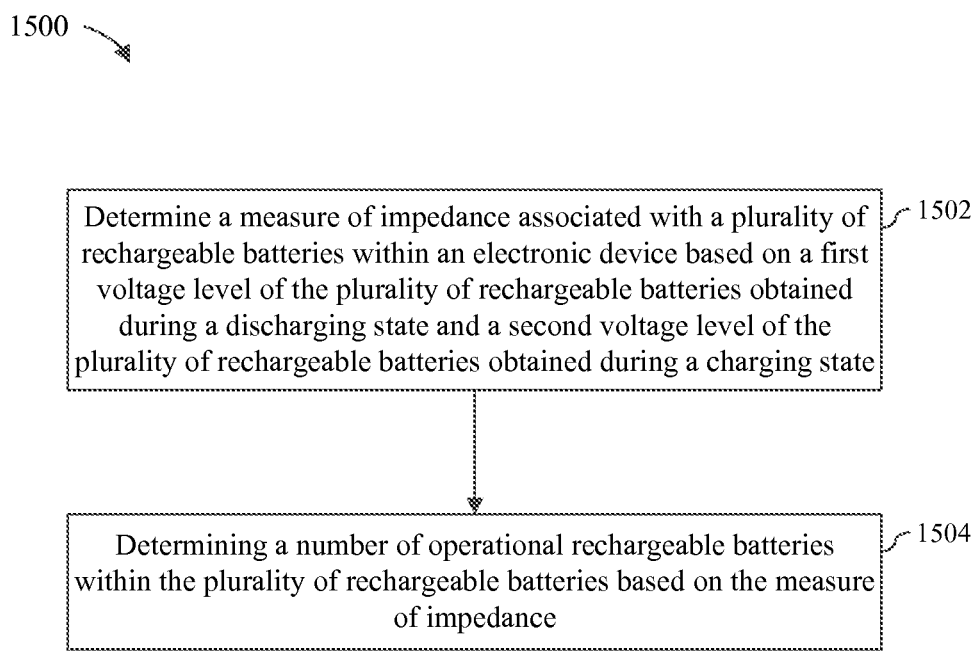

FIG. 15 depicts a flowchart of a method for automatically determining a number of operational rechargeable batteries within a device that includes a plurality of rechargeable batteries.

Figure 16:
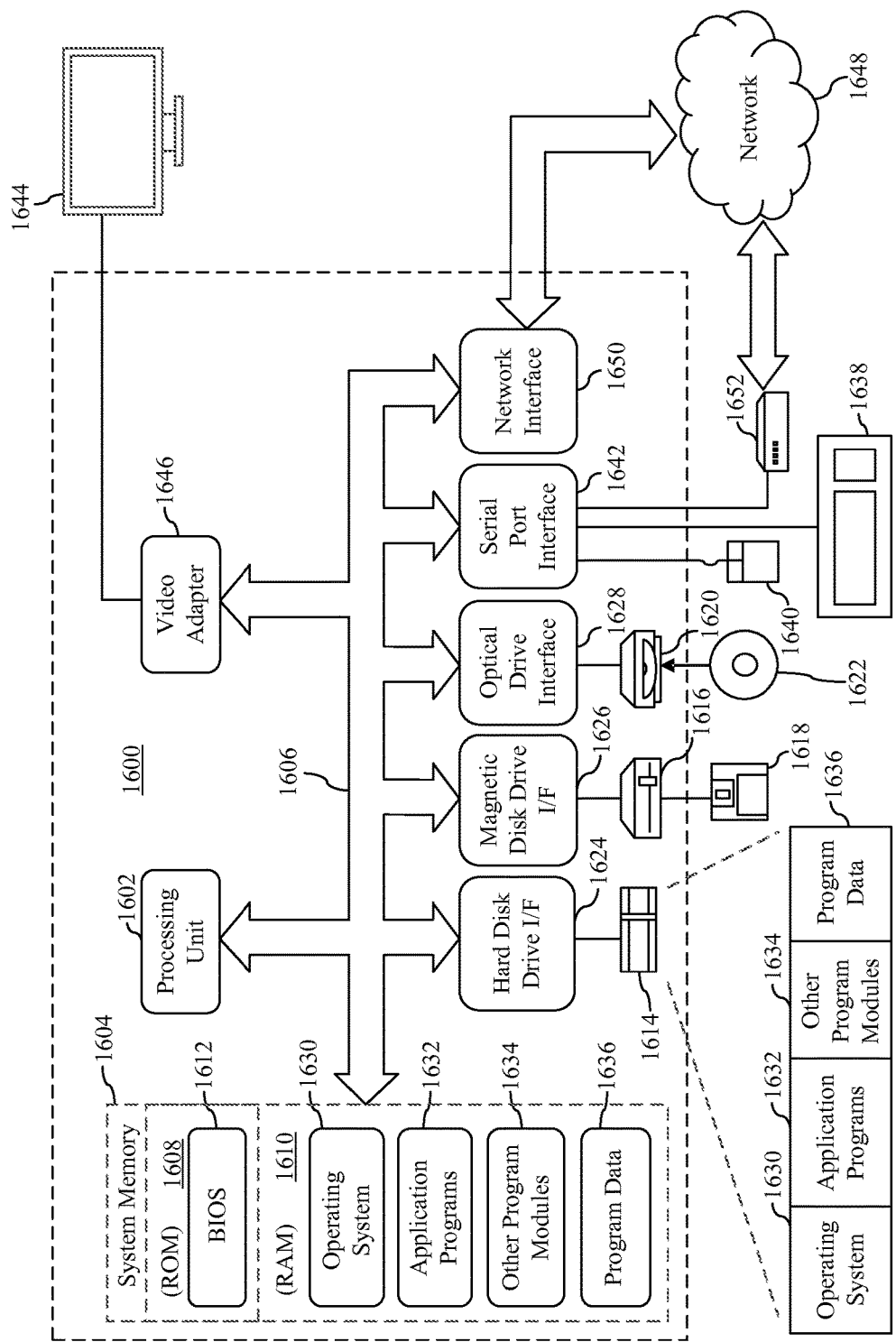

FIG. 16 is a block diagram of an example processor-based computer system that may be used to implement various embodiments.

The features and advantages of the embodiments described herein will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

I. Introduction

The following detailed description discloses numerous example embodiments. The scope of the present patent application is not limited to the disclosed embodiments, but also encompasses combinations of the disclosed embodiments, as well as modifications to the disclosed embodiments.

References in the specification to "one embodiment," "an embodiment," "an example embodiment," or the like, indicate that the embodiment described may include a particular feature, structure, or characteristic, but every embodiment may not necessarily include the particular feature, structure, or characteristic. Moreover, such phrases are not necessarily referring to the same embodiment. Furthermore, when a particular feature, structure, or characteristic is described in connection with an embodiment, it is submitted that it is within the knowledge of persons skilled in the relevant art(s) to implement such feature, structure, or characteristic in connection with other embodiments whether or not explicitly described.

As noted in the Background Section above, a wide variety of electronic devices are being manufactured that include multiple rechargeable batteries. However, due to issues that may arise during manufacturing, it is possible that not all of the batteries within such a device will be operational. For example, due to device miniaturization, it has become a challenge to reliably connect very small rechargeable batteries to their associated loads during manufacturing. If a rechargeable battery is not well connected to its load and this issue is not detected at the factory, then a device may be shipped in which the number of functioning batteries is less than the total number of batteries in the device. Such a device will only have a fraction of its advertised battery life.

Consequently, it is desirable to verify that all the rechargeable batteries in a device are operational before shipping the device from the factory. However, in many cases, the rechargeable batteries embedded within an electronic device cannot be easily accessed after the device has been manufactured. In these cases, taking the device apart to inspect the batteries and their connections can be both expensive and time-consuming. In some cases, the rechargeable batteries are sealed within the device housing in such a manner that the housing must be broken to access the batteries, thereby resulting in irreversible damage to the device.

Embodiments described herein address the foregoing issues by providing a way to automatically determine whether all the rechargeable batteries within an electronic device are functioning without having to open up the electronic device to access the batteries stored therein. For example, in one embodiment, a computing device can be connected to the electronic device via a port thereof (e.g., a combined data/charging port such as a USB port) and communicate therewith to execute an algorithm that determines the number of rechargeable batteries within the device that are functioning. An indication of the number of functioning batteries can then be provided to an operator of the computing device via a user interface thereof. The disclosed method can be applied, for example, at a factory to identify electronic devices with non-functioning batteries to avoid shipping such devices to retailers and/or customers.

However, even if all the rechargeable batteries within an electronic device are working when the device is first shipped, one or more of the batteries may become non-functioning after the device has been purchased by a customer. For example, due to wear and tear on the device, a rechargeable battery may become disconnected from its load. In such a case, the customer may become aware that the battery life of the product has been reduced but may have no idea why. Furthermore, even if the customer could determine that a subset of the rechargeable batteries has ceased operating, the customer typically has no means of addressing the issue. At best, the customer can send the device to the manufacturer or a third party for repair. However, some battery issues cannot be easily repaired and in some cases the batteries cannot be accessed without irreversibly damaging the device.

Further embodiments described herein can help address some or all of these issues. For example, in an embodiment, the electronic device itself can execute an algorithm to determine the number of functioning batteries. If the electronic device determines that not all of the rechargeable batteries are operational then the electronic device can carry out certain operations. For example, the electronic device can generate a message or other user-discernable indication that one or more batteries are not functioning and present such an indication to the user via a user interface of the electronic device (or via some other channel) so that the user is made aware of the issue and can seek to have the device repaired if repair is an option. As another example, in response to determining that not all of the rechargeable batteries are operational, the electronic device can take steps to reduce power consumption by the electronic device to at least partially compensate for the non-functioning battery. For example, the electronic device can deactivate certain device components or modify a manner of operation of certain device components so that such components consume less power.

In certain embodiments, the algorithm that is used to determine the number of functioning batteries operates by estimating an impedance of the rechargeable batteries and then comparing the estimated impedance to expected impedances for different numbers of functioning batteries. The impedance may be estimated by sampling a first voltage level of the rechargeable batteries at a predetermined time after the rechargeable batteries have been disconnected from a charging power source, sampling a second voltage level of the rechargeable batteries at a predetermined time after the rechargeable batteries have been reconnected to the charging power source, and then taking the difference between the second voltage level and the first voltage level.

The algorithm may be applied when the detected voltage level of the rechargeable batteries is within a target range in which the estimated impedance for different numbers of batteries (e.g., one battery vs. two batteries) can be expected to vary significantly even when the first voltage level and second voltage level samples are taken very close in time. In certain embodiments, this range substantially corresponds to forty to sixty percent of the maximum voltage level of the rechargeable batteries in the electronic device. By applying the algorithm when the detected voltage level of the rechargeable batteries is within the target range, the number of functioning batteries can be determined relatively quickly (e.g., in less than 10 seconds in some embodiments) which is a significant advantage when the algorithm is being used to test electronic devices within a factory that must quickly produce a large volume of such electronic devices.

In the following sections, embodiments of the aforementioned systems, methods and computer program products will be more fully described. In particular, Section II describes systems, methods and computer program products that automatically determine a number of functioning rechargeable batteries within an electronic device that includes a plurality of rechargeable batteries. Section III describes an example processor-based computer system that may be used to implement various embodiments. Section IV describes some additional exemplary embodiments. Section V provides some concluding remarks.

Figure 1:
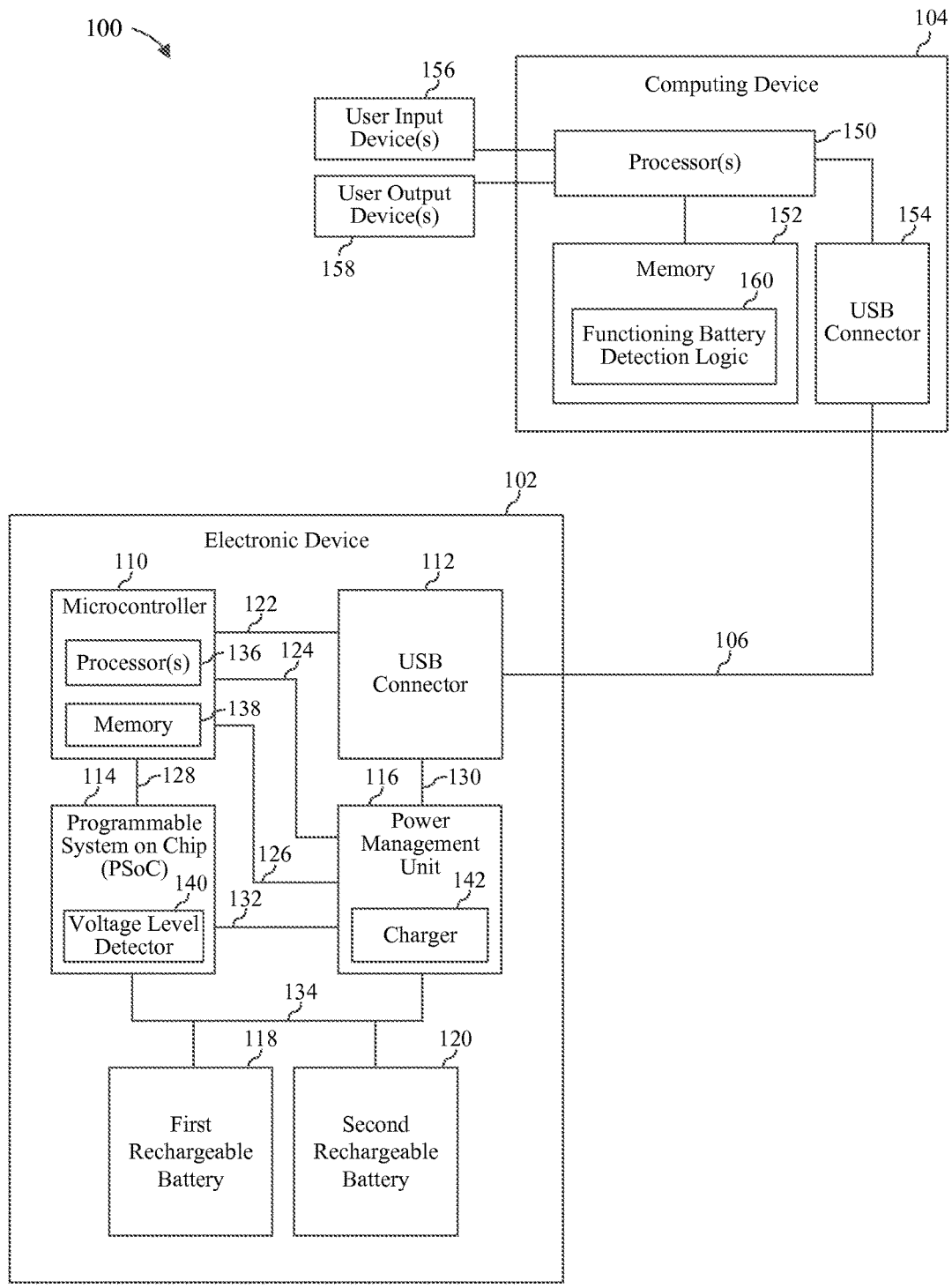
FIG. 1 is a block diagram of a system in which a computing device is used to automatically determine a number of functioning rechargeable batteries within an electronic device that is connected thereto.

II. Systems, Methods and Computer Program Products for Automatically Determining a Number of Functioning Rechargeable Batteries within an Electronic Device that Includes a Plurality of Rechargeable Batteries FIG. 1 is a block diagram of a system 100 in which a computing device is utilized to determine a number of functioning rechargeable batteries within an electronic device that includes a plurality of rechargeable batteries. In particular, as shown in FIG. 1, system 100 includes a computing device 104 that is connected to an electronic device 102 that includes a plurality of rechargeable batteries. Computing device 104 is operable to automatically determine the number of functioning batteries within the plurality of rechargeable batteries in electronic device 102.

Electronic device 102 represents merely one example of an electronic device that includes a plurality of rechargeable batteries and to which the techniques described herein can be applied. In particular, electronic device 102 represents a wearable fitness device, such as the MICROSOFT BAND™, produced by Microsoft Corporation of Redmond, Wash. However, persons skilled in the relevant art(s) will appreciate that the techniques described herein can be readily applied to any of a wide variety of electronic devices that include a plurality of rechargeable batteries, including but by no means limited to smart phones, tablet computers, wearable computers and devices, cameras, personal media players, handheld video game consoles, video game controllers, and Internet of Things devices. Thus, it is to be understood that electronic device 102 is described herein by way of example only and not limitation.

As shown in FIG. 1, electronic device 102 comprises a number of interconnected components including a microcontroller 110, a Universal Serial Bus (USB) connector 112, a programmable system on chip (PSoC) 114, a power management unit 116, a first rechargeable battery 118 and a second rechargeable battery 120. Each of these components will now be described.

Microcontroller 110 comprises an integrated circuit chip that includes one or more processors 136 and memory 138. Generally speaking, processor(s) 136 operate to manage various components and operations of electronic device 102 via the execution of firmware that is loaded into memory 138. For example and without limitation, processor(s) 136 may execute firmware for managing a user interface of electronic device 102, executing applications on behalf of a user thereof, collecting sensor data from PSoC 114, managing a wireless (e.g., Bluetooth) connection with an external device (e.g., a smart phone) for the purposes of receiving information therefrom and passing information thereto, managing power management unit 116, and the like. In an embodiment, microcontroller 110 comprises an ARM® CORTEX® M4 MCU, a microcontroller that includes a processor core produced by ARM Ltd. of Cambridge, United Kingdom, although this is only an example.

PSoC 114 comprises a microcontroller-based integrated circuit chip that includes a central processing unit (CPU) core and mixed-signal arrays of configurable integrated analog and digital peripherals. In an embodiment, PSoC 114 is configured to collect sensor information from a plurality of sensors included within electronic device 102 (not shown in FIG. 1) and to provide such sensor information to microcontroller 110. The sensors may include, for example and without limitation, a Global Positioning System (GPS) sensor, a gyrometer, an accelerometer, a heart rate sensor, an ambient light sensor, a skin temperature sensor, an ultraviolet (UV) level sensor, a galvanic skin response sensor, and a microphone. Data communication between PSoC 114 and microcontroller 110 is carried out over a data communication bus 128, which in one embodiment comprises an I2C serial data communication bus.

As shown in FIG. 1, PSoC 114 also includes a voltage level detector 140. Voltage level detector 140 comprises a component that is operable to intermittently determine a voltage level associated with first rechargeable battery 118 and second rechargeable battery 120. In particular, voltage level detector 140 is operable to intermittently determine a voltage level on a power supply connector 134 that is connected to each of first rechargeable battery 118 and second rechargeable battery 120. Such information is passed from PsoC 114 to microcontroller 110 via data communication bus 128 to be used thereby in a manner that will be described herein. Although in the embodiment shown in FIG. 1, voltage level detector 140 is implemented as part of PSoC 114, persons skilled in the art will readily appreciate that other components (e.g., battery gauges, analog-to-digital converters, or the like) may be used to monitor the voltage level associated with first rechargeable battery 118 and second rechargeable battery 120 and to provide voltage level readings to microcontroller 110. Furthermore, voltage level detector 140 may comprise part of microcontroller 110 itself.

First rechargeable battery 118 and second rechargeable battery 120 are connected in parallel to power supply connector 134 via which power is supplied from first rechargeable battery 118 and second rechargeable battery 120 to power management unit 116. As noted above, voltage level detector 140 of PSoC 114 is also connected to power supply connector 134 and is operable to monitor the voltage level thereon. In an embodiment, each of first rechargeable battery 118 and second rechargeable battery 120 comprise a 100 mAh lithium-ion battery, although this is only an example. Although only two rechargeable batteries are included in electronic device 102, persons skilled in the relevant art(s) will appreciate that the techniques described herein can be applied to electronic devices having more than two rechargeable batteries.

Power management unit 116 is configured to supply power to various subsystems of electronic device 102 at voltage levels that are suitable for those subsystems. For example, as shown in FIG. 1, power management unit 116 supplies power to microcontroller 110 via a power supply connector 124 and supplies power to PSoC 114 via a power supply connector 132. Power management unit 116 also includes a charger 142. When an external power source is connected to USB connector 112 and power management unit 116 activates charger 142, charger 142 will operate to charge first rechargeable battery 118 and second rechargeable battery 120 with a fixed charging current using power supplied by the external power source and passed to power management unit 116 via a power supply connector 130.

As will be discussed herein, microcontroller 110 is capable of communicating with power management unit 116 and to control the operations thereof. Such communication is carried out over a data communication bus 126, which in one embodiment comprises an I2C serial data communication bus. Data may also be passed between an external device connected to USB connector 112 and microcontroller 110 via a USB data bus 122.

In FIG. 1, a USB cable 106 connects computing device 104 to electronic device 102. As will be appreciated by persons skilled in the relevant art(s), USB cable 106 enables computing device 104 both to provide power to electronic device 102 and also to exchange data therewith. It is noted that in alternate embodiments, other types of wired or wireless links may be used to transfer power from computing device 104 to electronic device 102 and to exchange data there between. Power and data may be transferred over the same link (as shown in FIG. 1) or via separate links depending upon the implementation.

Computing device 104 is intended to represent a machine controlled by one or more processors (e.g., microprocessors or microprocessor cores) that can execute software for a variety of purposes. Computing device 104 may comprise, for example, and without limitation, a desktop computer, a laptop computer, a tablet computer, a netbook, or the like, although these examples are not intended to be limiting. As shown in FIG. 1, computing device 104 comprises one or more processors 150 and a memory 152. Generally speaking, processor(s) 150 operate to execute computer program logic that is stored in memory 152 to perform various operations.

Computing device 104 also includes a USB connector 154 that is connected to processor(s) 150 and that is adapted to be connected to USB cable 106, thereby enabling the transfer of power from computing device 104 to electronic device 102 as well as the sharing of data there between. Computing device 104 also includes or is connected to one or more user input devices 156 and one or more user output devices 158. User input device(s) 156 may comprise, for example and without limitation, one or more of a keyboard, a mouse, a touch screen, or the like. User output device(s) 158 may comprise, for example and without limitation, a display, one or more audio speakers, or the like.

A more detailed example of a processor-based computing device is described below in reference to FIG. 16. Such processor-based computing device may be used to implement computing device 104.

As shown in FIG. 1, memory 152 of computing device 104 stores functioning battery detection logic 160. Functioning battery detection logic 160 comprises computer program logic (i.e., software instructions) that, when executed by processor(s) 150, causes processor(s) 150 to perform operations that determine a number of functioning rechargeable batteries in electronic device 102. Functioning battery detection logic 160 may be further operable to present an indication of the number of functioning batteries to an operator of computing device 104 via a user interface thereof (e.g., via a graphical user interface rendered to a display). The manner of operation of functioning battery detection logic 160 will be described in more detail below.

Generally speaking, functioning battery detection logic 160 operates by estimating an impedance of the rechargeable batteries in electronic device 102 and then comparing the estimated impedance to expected impedances for different numbers of functioning batteries. In an embodiment, the impedance is estimated by determining a first voltage level of the rechargeable batteries at a predetermined time after disabling charging of the rechargeable batteries by an external power source, determining a second voltage level of the rechargeable batteries at a predetermined time after enabling the charging of the rechargeable batteries by the external power source, and then taking the difference between the second voltage level and the first voltage level.

The method implemented by functioning battery detection logic 160 is premised on the insight that, when charging the rechargeable batteries with a fixed charging current, the voltage level change observed over a given amount of time will be greater if less than all the batteries are operational than if all batteries are operational due to the reduced impedance associated with the lesser number of batteries. Similarly, when the rechargeable batteries are discharging, the voltage level change observed over a given amount of time will be greater if less than all the batteries are operational than if all batteries are operational. The method implemented by functioning battery detection logic 160 leverages this insight by determining a first voltage level of the rechargeable batteries during discharge and then determining a second voltage level of the rechargeable batteries during charge to calculate a difference there between that is large enough to be detected consistently and to determine how many rechargeable batteries are present and working. Since the charging current is fixed, this voltage difference alone can provide an estimate of an impedance of the rechargeable batteries.

In an embodiment, to enable fast detection of the number of functioning rechargeable batteries within electronic device 102, functioning battery detection logic 160 estimates the impedance of the rechargeable batteries when the detected voltage level thereof is within a target range in which the estimated impedance for one battery and the estimated impedance for two batteries can be expected to vary significantly even when the first voltage level sample and second voltage level sample are taken very close in time. In certain embodiments, this range substantially corresponds to forty to sixty percent of the maximum voltage level of the rechargeable batteries in the electronic device. By applying the algorithm when the detected voltage level of the rechargeable batteries is within this target range, the number of functioning batteries can be determined relatively quickly (e.g., in less than 10 seconds in some embodiments).

A manner by which a target voltage level range for estimating impedance was determined for an embodiment in which the rechargeable batteries comprise two 100 mAh lithium-ion batteries will now be described in reference to FIGS. 2-5.

Figure 2:
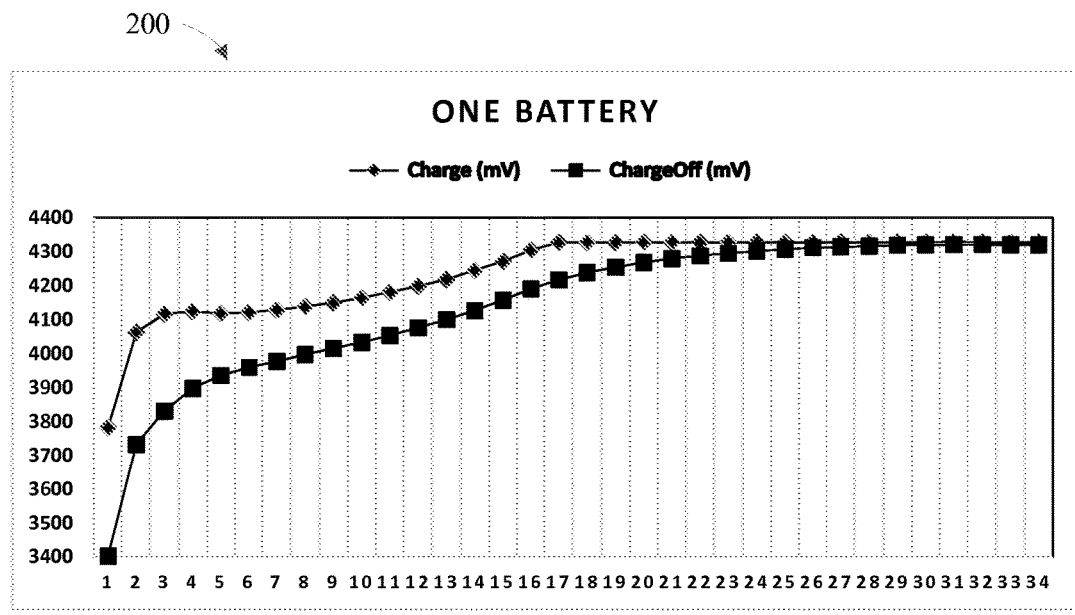
FIG. 2 is a graph that shows how the voltage level of a single rechargeable battery being charged by a power source varies over time with samples being taken intermittently while the rechargeable battery is temporarily disconnected from the power source ("ChargeOff" samples) and after the rechargeable battery is reconnected to the power source ("Charge" samples).

In particular, FIG. 2 is a graph 200 that shows how the voltage level of a single rechargeable battery being charged by a power source using a fixed charging current varied over time with samples being taken intermittently while the rechargeable battery was temporarily disconnected from the power source ("ChargeOff" samples) and then after the rechargeable battery was reconnected to the power source ("Charge" samples). In graph 200, the horizontal axis represents the sampling instances, with sampling occurring once every 2 minutes. The vertical axis represents the detected voltage level of the single rechargeable battery in millivolts (mV). During each sampling instance, the charging of the rechargeable battery was disabled and two seconds thereafter the voltage level thereof was sampled, thereby generating a new "ChargeOff" sample. Then, the charging of the rechargeable battery was re-enabled and two seconds thereafter the voltage level thereof was sampled, thereby generating a new "Charge" sample. The total time between the generation of each "ChargeOff" and "Charge" sample was approximately 10 seconds.

Figure 3:
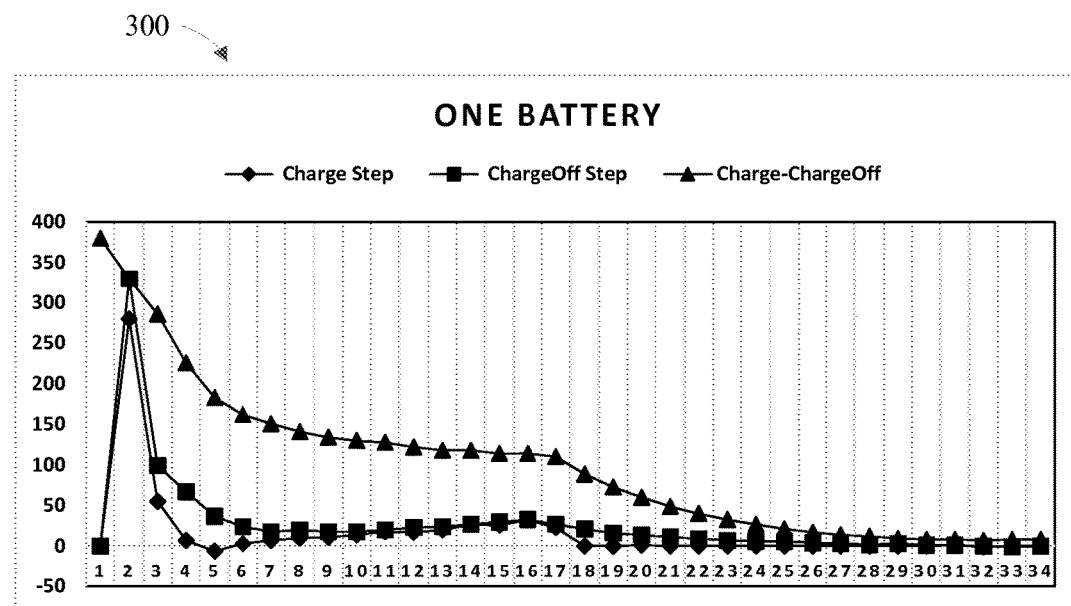
FIG. 3 is a graph showing how the voltage level difference between the "Charge" and "ChargeOff" samples of FIG. 2 varies over time, how the step size between adjacent "ChargeOff" samples of FIG. 2 varies over time, and how the step size between adjacent "Charge" samples of FIG. 2 varies over time.

Graph 300 of FIG. 3 shows how the voltage level difference between the "Charge" and "ChargeOff" samples of graph 200 varies over time ("Charge–Charge Off"), how the step size between adjacent "ChargeOff" samples of graph 200 varies over time ("ChargeOff Step"), and how the step size between adjacent "Charge" samples of graph 200 varies over time ("Charge Step"). The horizontal axis of graph 300 represents sampling instances and the vertical axis represents the various measurements in mV.

Figure 4:
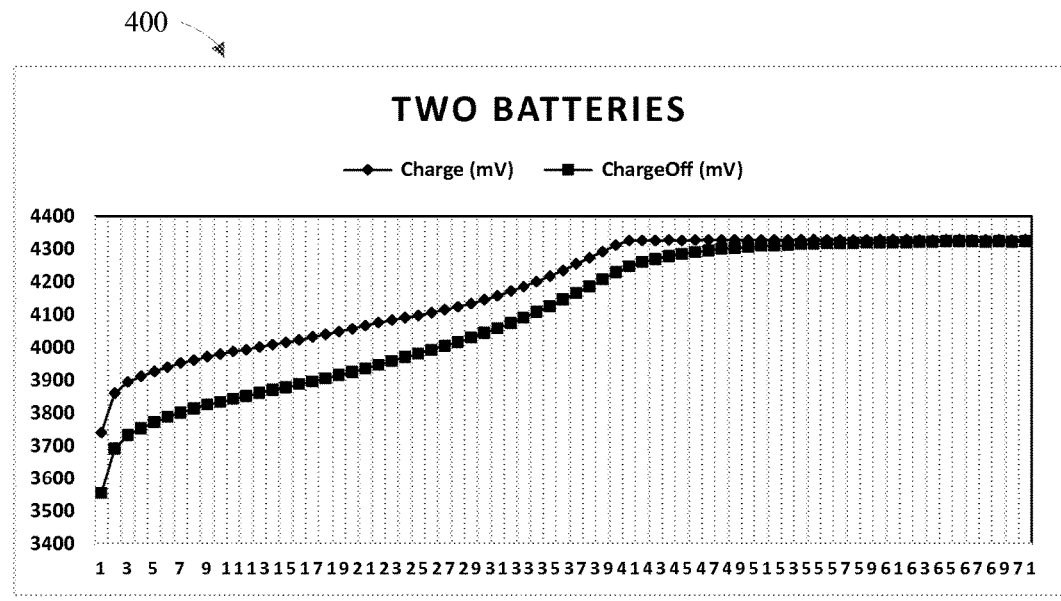
FIG. 4 is a graph that shows how the voltage level of two rechargeable batteries being charged by a power source varies over time with samples being taken intermittently while the two rechargeable batteries are temporarily disconnected from the power source ("ChargeOff" samples) and after the two rechargeable batteries are reconnected to the power source ("Charge" samples).

FIG. 4 is a graph 400 that shows the results when the same technique used to generate graph 200 was applied to two rechargeable batteries operating in parallel. In particular, graph 400 shows how the voltage level of two rechargeable batteries being charged by a power source using a fixed charging current varied over time with samples being taken intermittently while the two rechargeable batteries were temporarily disconnected from the power source ("ChargeOff" samples) and then after the two rechargeable batteries were reconnected to the power source ("Charge" samples). The horizontal axis of graph 400 represents the sampling instances, with sampling occurring once every 2 minutes, and the vertical axis represents the detected voltage level of the two rechargeable batteries in mV.

Figure 5:
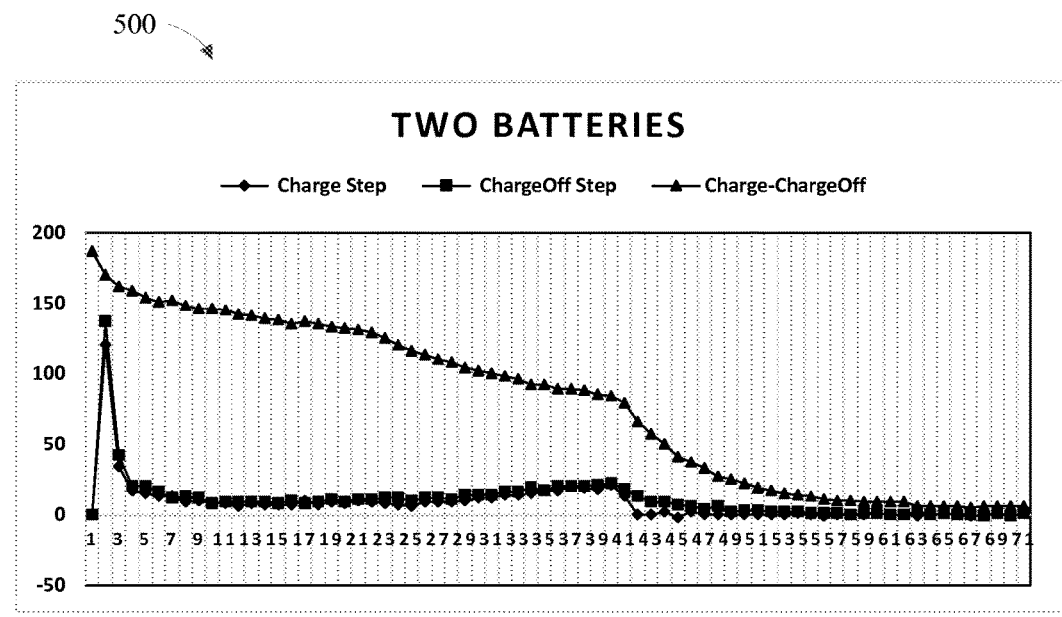
FIG. 5 is a graph showing how the voltage level difference between the "Charge" and "ChargeOff" samples of FIG. 4 varies over time, how the step size between adjacent "ChargeOff" samples of FIG. 4 varies over time, and how the step size between adjacent "Charge" samples of FIG. 4 varies over time.

Graph 500 of FIG. 5 shows how the voltage level difference between the "Charge" and "ChargeOff" samples of graph 400 varies over time ("Charge–Charge Off"), how the step size between adjacent "ChargeOff" samples of graph 400 varies over time ("ChargeOff Step"), and how the step size between adjacent "Charge" samples of graph 400 varies over time ("Charge Step"). The horizontal axis of graph 500 represents sampling instances and the vertical axis represents the various measurements in mV.

If one compares the "Charge–ChargeOff" curve for one battery (as shown in graph 300) to the "Charge–ChargeOff" curve for two batteries (as shown in graph 500), one can see that significant differences between the curves occur when the detected voltage level during charging is in a range of approximately 3900-4200 mV. For this reason, in an embodiment, the voltage level samples that are taken to estimate impedance are taken when the detected voltage level of the rechargeable batteries while charging is in a target range of 3900-4200 mV. This corresponds roughly to 40% to 60% of the maximum voltage level of the rechargeable batteries in this particular embodiment. A similar technique to that described above may be used to identify a target voltage range for estimating impedance for other types and number of rechargeable batteries. For example, a similar technique to that described above may be used to identify a target voltage range in which to estimate impedance for determining whether one, two, or three rechargeable batteries are functioning within a device that includes three rechargeable batteries. Such a target voltage range will be one in which significant differences exist between the "Charge–ChargeOff" curves for one, two, and three functioning batteries. The method can likewise be extended to four or more batteries.

A manner by which functioning battery detection logic 160 may operate to automatically determine the number of functioning rechargeable batteries within electronic device 102 will now be described in reference to flowchart 600 of FIG. 6. Although the method of flowchart 600 will be described with continued reference to the components of system 100, it is to be understood that the method may be implemented in other systems and by other components. Furthermore, although the method of flowchart 600 may be used to determine whether there is one functioning rechargeable battery or two functioning rechargeable batteries within an electronic device, persons skilled in the relevant art will appreciate that the method can be extended to determine the number of functioning batteries in devices having three or more rechargeable batteries.

Prior to initiation of the method of flowchart 600, it is assumed that computing device 104 has been connected to electronic device 102 via USB cable 106 as shown in FIG. 1 and that charger 142 within power management unit 116 has been enabled such that first rechargeable battery 118 and second rechargeable battery 120 are being charged by computing device 104.

Figure 6:
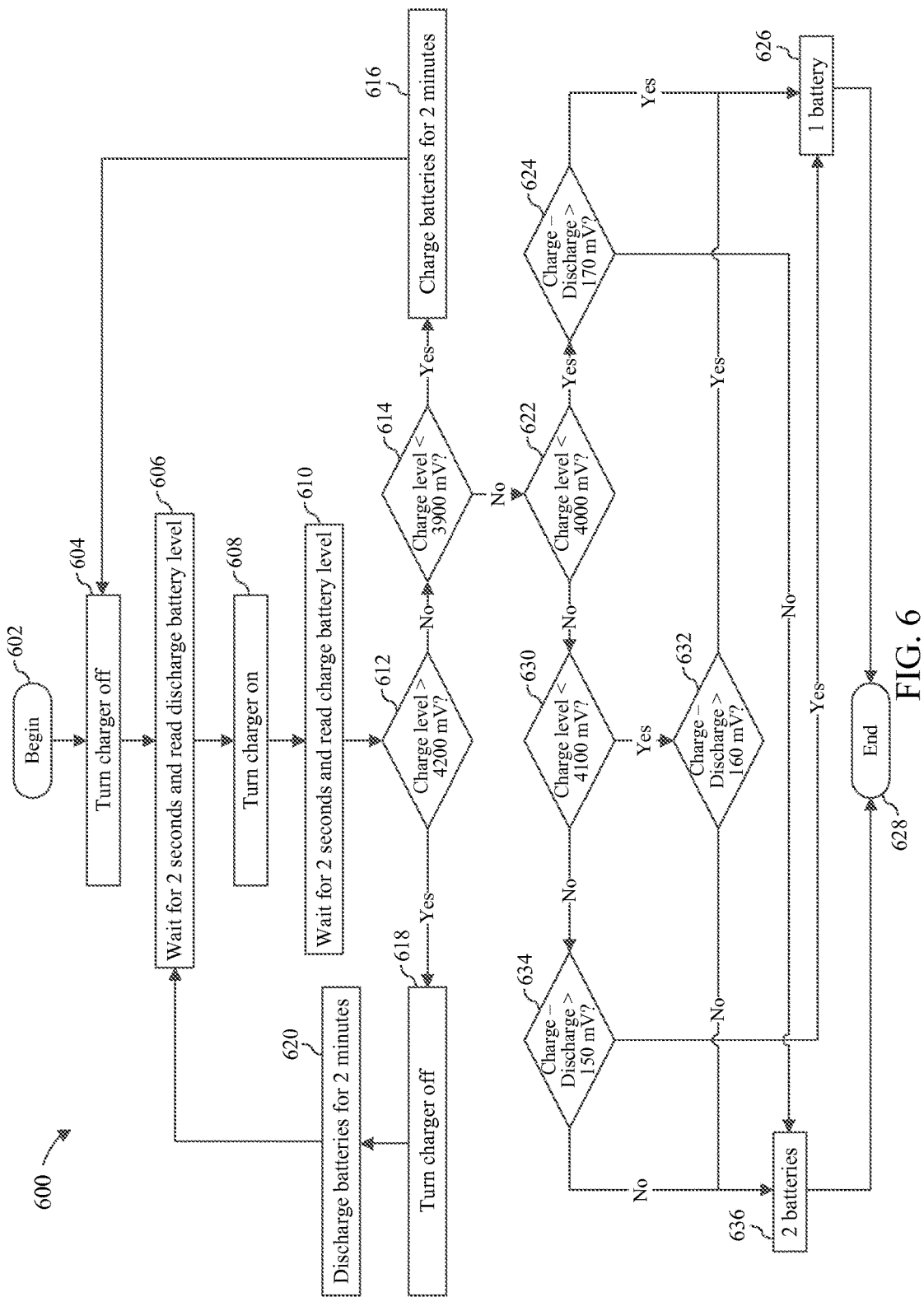
FIG. 6 depicts a flowchart of a method for automatically determining a number of functioning rechargeable batteries within an electronic device that includes two rechargeable batteries.

As shown in FIG. 6, the method of flowchart 600 is initiated at step 602, after which control flows to step 604. At step 604, functioning battery detection logic 160 causes charger 142 to be turned off. In an embodiment, functioning battery detection logic 160 performs this step by sending a message to microcontroller 110 of electronic device 102 via USB cable 106 and USB data bus 122 that indicates that charger 142 should be turned off. In response to receiving this message, microcontroller 110 sends a command to power management unit 116 via data communication bus 126 that causes power management unit 116 to turn charger 142 off, thereby disabling the charging of first rechargeable battery 118 and second rechargeable battery 120.

At step 606, functioning battery detection logic 160 obtains a discharge battery level reading that is taken two seconds after charger 142 is turned off. In an embodiment, functioning battery detection logic 160 performs this step by sending a message to microcontroller 110 of electronic device 102 via USB cable 106 and USB data bus 122 that requests a discharge battery level sample. In response to receiving the message, microcontroller 110 returns the requested discharge battery level sample via the same communication path. Microcontroller 110 obtains the desired discharge battery level sample from PSoC 114 via data communication bus 128. The discharge battery level sample is the voltage level observed by voltage level detector 140 on power supply connector 134 two seconds after charger 142 is disabled.

In an embodiment, voltage level detector 140 of PSoC 114 monitors the voltage level on power supply connector 134 and periodically (e.g. once every second) provides a voltage level sample to microcontroller 110 via data communication bus 128. In further accordance with this embodiment, as part of step 606, microcontroller 110 may return a voltage level sample that was provided by PSoC 114 two seconds after charger 142 was disabled. In an alternate embodiment, microcontroller 110 may send a request to PSoC 114 to obtain the desired voltage level sample.

At step 608, functioning battery detection logic 160 causes charger 142 to be turned back on. In an embodiment, functioning battery detection logic 160 performs this step by sending a message to microcontroller 110 of electronic device 102 via USB cable 106 and USB data bus 122 that indicates that charger 142 should be turned on. In response to receiving this message, microcontroller 110 sends a command to power management unit 116 via data communication bus 126 that causes power management unit 116 to turn on charger 142, thereby enabling the charging of first rechargeable battery 118 and second rechargeable battery 120 by computing device 104.

At step 610, functioning battery detection logic 160 obtains a charge battery level reading that is taken two seconds after charger 142 is turned back on. In an embodiment, functioning battery detection logic 160 performs this step by sending a message to microcontroller 110 of electronic device 102 via USB cable 106 and USB data bus 122 that requests a charge battery level sample. In response to receiving the message, microcontroller 110 returns the requested charge battery level sample via the same communication path. Microcontroller 110 obtains the desired charge battery level sample from PSoC 114 via data communication bus 128. The charge battery level sample is the voltage level observed by voltage level detector 140 on power supply connector 134 two seconds after charger 142 has been enabled.

As noted above, in an embodiment, voltage level detector 140 of PSoC 114 monitors the voltage level on power supply connector 134 and periodically (e.g. once every second) provides a voltage level sample to microcontroller 110 via data communication bus 128. In further accordance with this embodiment, as part of step 610, microcontroller 110 may return a voltage level sample that was provided y PSoC 114 two seconds after charger 142 was enabled. In an alternate embodiment, microcontroller 110 may send a request to PSoC 114 to obtain the desired voltage level sample.

At decision step 612, functioning battery detection logic 160 determines whether the charge battery level is greater than 4200 mV. If functioning battery detection logic 160 determines that the charge battery level is greater than 4200 mV, then functioning battery detection logic 160 turns charger 142 off as shown in step 618 (in a like manner to that described above in reference to step 604) and allows first rechargeable battery 118 and second rechargeable battery 120 to discharge for two minutes as shown at step 620. After two minutes, functioning battery detection logic 160 resumes the process back at step 606, to collect a new discharge battery level sample and charge battery level sample.

If functioning battery detection logic 160 determines at decision step 612 that the charge battery level is not greater than 4200 mV, then control flows to decision step 614. At decision step 614, functioning battery detection logic 160 determines whether the charge battery level is less than 3900 mV. If functioning battery detection logic 160 determines that the charge battery level is less than 3900 mV, then functioning battery detection logic 160 allows first rechargeable battery 118 and second rechargeable battery 120 to be charged for two minutes as shown at step 616. After two minutes, functioning battery detection logic 160 resumes the process back at step 604, to collect a new discharge battery level sample and charge battery level sample.

If functioning battery detection logic 160 determines at decision step 614 that the charge battery level is not less than 3900 mV, then control flows to decision step 622. At decision step 622, functioning battery detection logic 160 determines whether the charge battery level is less than 4000 mV. If functioning battery detection logic 160 determines that the charge battery level is less than 4000 mV, then control flows to decision step 624. At decision step 624, functioning battery detection logic 160 determines whether the difference between the charge battery level and the discharge battery level is greater than 170 mV. If the difference between the charge battery level and the discharge battery level is greater than 170 mV, then functioning battery detection logic 160 determines that there is one functioning battery in electronic device 102 as shown at step 626, after which the method ends as shown at step 628. If the difference between the charge battery level and the discharge battery level is not greater than 170 mV, then functioning battery detection logic 160 determines that there are two functioning batteries in electronic device 102 as shown at step 636, after which the method ends as shown at step 628.

If functioning battery detection logic 160 determines at decision step 622 that the charge battery level is not less than 4000 mV, then control flows to decision step 630. At decision step 630, functioning battery detection logic 160 determines whether the charge battery voltage is less than 4100 mV. If functioning battery detection logic 160 determines that the charge battery level is less than 4100 mV, then control flows to decision step 632. At decision step 632, functioning battery detection logic 160 determines whether the difference between the charge battery level and the discharge battery level is greater than 160 mV. If the difference between the charge battery level and the discharge battery level is greater than 160 mV, then functioning battery detection logic 160 determines that there is one functioning battery in electronic device 102 as shown at step 626, after which the method ends as shown at step 628. If the difference between the charge battery level and the discharge battery level is not greater than 160 mV, then functioning battery detection logic 160 determines that there are two functioning batteries in electronic device 102 as shown at step 636, after which the method ends as shown at step 628.

If functioning battery detection logic 160 determines at decision step 630 that the charge battery level is not less than 4100 mV, then control flows to decision step 634. At decision step 634, functioning battery detection logic 160 determines whether the difference between the charge battery level and the discharge battery level is greater than 150 mV. If the difference between the charge battery level and the discharge battery level is greater than 150 mV, then functioning battery detection logic 160 determines that there is one functioning battery in electronic device 102 as shown at step 626, after which the method ends as shown at step 628. If the difference between the charge battery level and the discharge battery level is not greater than 150 mV, then functioning battery detection logic 160 determines that there are two functioning batteries in electronic device 102 as shown at step 636, after which the method ends as shown at step 628.

In the foregoing method of flowchart 600, decision steps 612 and 614 operate to ensure that threshold testing to determine the number of functioning rechargeable batteries does not occur until the charge battery level is in the range of 3900-4200 mV. As discussed above, in one embodiment, this is a target range in which the estimated impedance for one battery and the estimated impedance for two batteries can be expected to vary significantly even when the first voltage level sample and second voltage level sample are taken very close in time.

Furthermore, in the foregoing method of flowchart 600, it can be seen that different thresholds are used for making the one battery vs. two battery decision, with the threshold being selected based upon the charge battery level. In particular, for a charge battery level less than 4000 mV, a threshold of 170 mV is used, for a charge battery level greater than or equal to 4000 mV and less than 4100 mV, a threshold of 160 mV is used, and for a charge battery level greater than or equal to 4100 mV, a threshold of 150 mV is used. By selecting the threshold based on the charge battery level, embodiments can fine tune the testing to account for how the estimated impedance for different number of batteries can be expected to differ at different charge battery levels.

After functioning battery detection logic 160 has determined the number of functioning batteries based on application of the method of flowchart 600, functioning battery determination logic 160 may operate to provide an operator of computing device 104 with an indication of the number of functioning batteries. For example, functioning battery detection logic 160 may provide an indication of the number of functioning batteries to the operator of the computing device via a user interface of computing device 104. In an embodiment in which user output device(s) 158 comprises a display, the user interface may comprise a graphical user interface rendered to the display. Still other methods of providing the indication may be utilized. The indication may be visual, auditory and/or haptic in nature.

Figure 7:
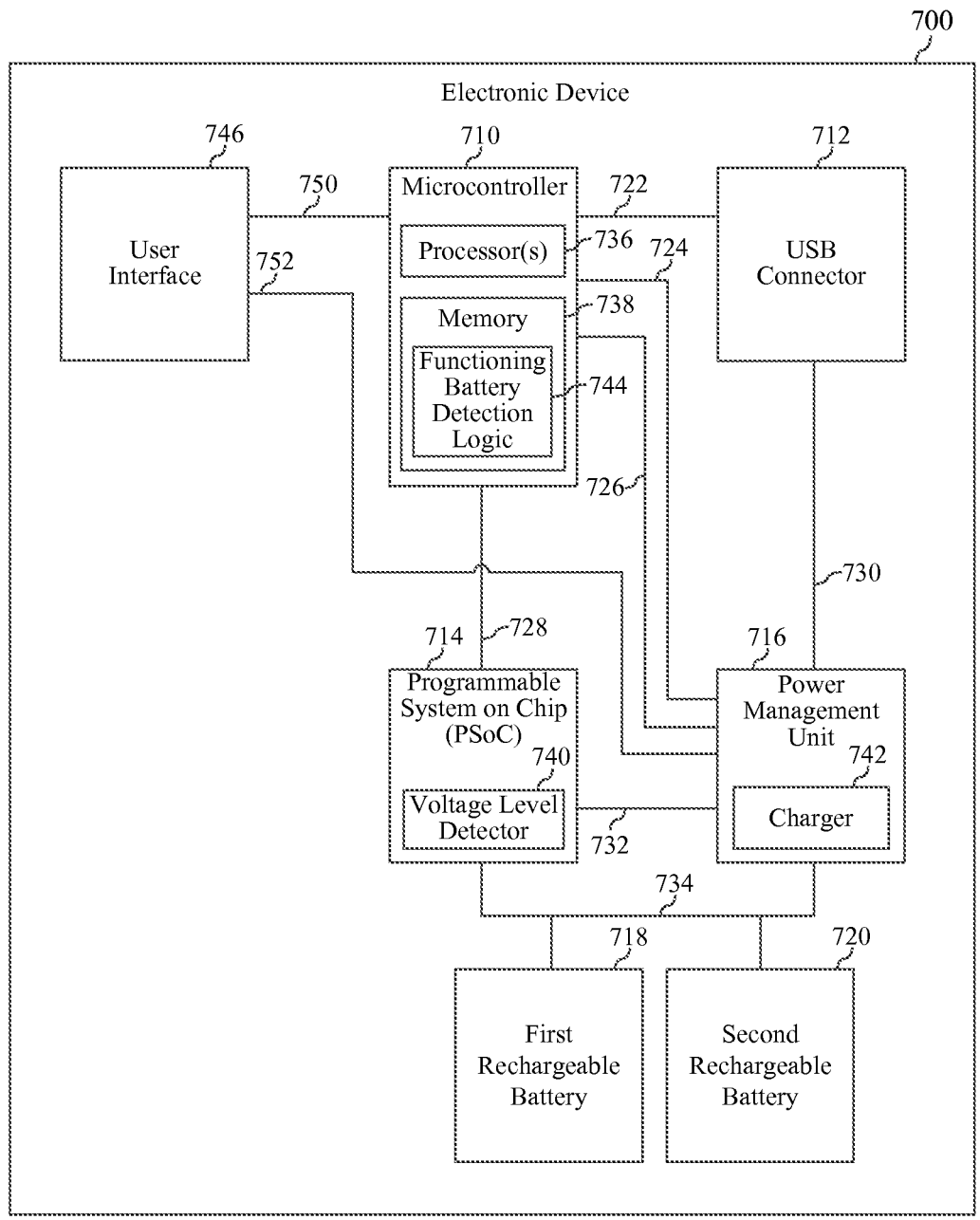
FIG. 7 is a block diagram of an electronic device that is operable to automatically determine a number of functioning rechargeable batteries included therein.

In system 100, computing device 104 executes the algorithm for determining the number of functioning rechargeable batteries within electronic device 102. FIG. 7 depicts an alternate embodiment in which an electronic device can, itself, determine the number of rechargeable batteries that are functioning within the device. In particular, FIG. 7 is a block diagram of an electronic device 700 that is operable to automatically determine a number of functioning rechargeable batteries included therein. In one embodiment, electronic device 700 represents a wearable fitness device, such as the MICROSOFT BAND™, produced by Microsoft Corporation of Redmond, Wash. However, as noted above, the techniques described herein can be readily applied to any of a wide variety of electronic devices that include a plurality of rechargeable batteries.

As shown in FIG. 7, electronic device 700 comprises a number of interconnected components including a microcontroller 710, a USB connector 712, a PSoC 714, a power management unit 716, a first rechargeable battery 718, a second rechargeable battery 720, and a user interface 746. Each of these components will now be described.

Microcontroller 710 comprises an integrated circuit chip that includes one or more processors 736 and memory 738. Generally speaking, processor(s) 736 operate to manage various components and operations of electronic device 700 via the execution of firmware that is loaded into memory 738. For example and without limitation, processor(s) 736 may execute firmware for managing user interface 746, executing applications on behalf of a user thereof, collecting sensor data from PSoC 714, managing a wireless (e.g., Bluetooth) connection with an external device (e.g., a smart phone) for the purposes of receiving information therefrom and passing information thereto, managing power management unit 716, and the like. In an embodiment, microcontroller 710 comprises an ARM® CORTEX® M4 MCU, a microcontroller that includes a processor core produced by ARM Ltd. of Cambridge, United Kingdom, although this is only an example.

PSoC 714 comprises a microcontroller-based integrated circuit chip that includes a CPU core and mixed-signal arrays of configurable integrated analog and digital peripherals. In an embodiment, PSoC 714 is configured to collect sensor information from a plurality of sensors included within electronic device 700 (not shown in FIG. 7) and to provide such sensor information to microcontroller 710. The sensors may include, for example and without limitation, a GPS sensor, a gyrometer, an accelerometer, a heart rate sensor, an ambient light sensor, a skin temperature sensor, a UV level sensor, a galvanic skin response sensor, and a microphone. Data communication between PSoC 714 and microcontroller 710 is carried out over a data communication bus 728, which in one embodiment comprises an I2C serial data communication bus.

As shown in FIG. 7, PSoC 714 also includes a voltage level detector 740. Voltage level detector 740 comprises a component that is operable to intermittently determine a voltage level associated with first rechargeable battery 718 and second rechargeable battery 720. In particular, voltage level detector 740 is operable to intermittently determine a voltage level on a power supply connector 734 that is connected to each of first rechargeable battery 718 and second rechargeable battery 720. Such information is passed from PsoC 714 to microcontroller 710 via data communication bus 728 to be used thereby in a manner described herein. Although in the embodiment shown in FIG. 7, voltage level detector 720 is implemented as part of PSoC 114, persons skilled in the art will readily appreciate that other components (e.g., battery gauges, analog-to-digital converters, or the like) may be used to monitor the voltage level associated with first rechargeable battery 718 and second rechargeable battery 720 and to provide voltage level readings to microcontroller 710. Furthermore, voltage level detector 740 may comprise part of microcontroller 710 itself.

First rechargeable battery 718 and second rechargeable battery 720 are connected in parallel to power supply connector 734 via which power is supplied from first rechargeable battery 718 and second rechargeable battery 720 to power management unit 716. As noted above, voltage level detector 740 of PSoC 714 is also connected to power supply connector 734 and is operable to monitor the voltage level thereon. In an embodiment, each of first rechargeable battery 718 and second rechargeable battery 720 comprise a 100 mAh lithium-ion battery, although this is only an example. Although only two rechargeable batteries are included in electronic device 700, persons skilled in the relevant art(s) will appreciate that the techniques described herein can be applied to electronic devices having more than two rechargeable batteries.

Power management unit 716 is configured to supply power to various subsystems of electronic device 700 at voltage levels that are suitable for those subsystems. For example, as shown in FIG. 7, power management unit 716 supplies power to microcontroller 710 via a power supply connector 724, supplies power to PSoC 714 via a power supply connector 732, and supplies power to user interface 746 via a power supply connector 752. Power management unit 716 also includes a charger 742. When an external power source is connected to USB connector 712 and power management unit 716 has activated charger 742, charger 742 will operate to charge first rechargeable battery 718 and second rechargeable battery 720 with a fixed charging current using power supplied by the external power source and passed to power management unit 716 via a power supply connector 730.

Microcontroller 710 is capable of communicating with power management unit 716 to control the operations thereof. Such communication is carried out over a data communication bus 726, which in one embodiment comprises an I2C serial data communication bus. Data may also be passed between an external device connected to USB connector 712 and microcontroller 710 via a USB data bus 722.

User interface 746 comprises one or more components by which microcontroller 710 can present information to a user of electronic device 700 and by which the user can interact with and access certain features of electronic device 700. In one embodiment, user interface 746 includes a touch screen display, although this is only an example. Data may be communicated between microcontroller 710 and user interface 746 via a data communication bus 750.

As shown in FIG. 7, memory 738 of microcontroller 710 stores functioning battery detection logic 744. Functioning battery detection logic 744 comprises computer program logic (i.e., software instructions) that, when executed by processor(s) 736, causes processor(s) 736 to perform operations that determine a number of functioning rechargeable batteries in electronic device 700. Functioning battery detection logic 744 may be further operable to present an indication of the number of functioning rechargeable batteries to a user of electronic device 700, wherein such indication may comprise an indication that the number of functioning rechargeable batteries in electronic device 700 is less than the total number of rechargeable batteries in electronic device 700. Such notification may be presented to the user, for example, via user interface 746. Such notification may be visual, auditory or haptic in nature.

Functioning battery detection logic 744 may operate in a similar manner as functioning battery detection logic 160 as described above in reference to FIG. 1 to determine the number of functioning rechargeable batteries within device 700. For example, with certain modifications, functioning battery detection logic 744 may apply the method of flowchart 600 as described above to determine the number of functioning rechargeable batteries within device 700. In the modified approach, the method would only be initiated when an external charging source was connected to USB connector 712 and charger 742 was enabled such that first rechargeable battery 718 and second rechargeable battery 720 were being charged by the external charging source. In further accordance with the modified approach, the method would also only be initiated if the detected charge battery level was in the range of 3900-4200 mV. Since this is the case, decision steps 612 and 614 need not be included in the process flow to ensure that the charge battery level is in this target range. Thus the process can flow directly from step 610 to decision step 622. Finally, since the process is being executed by microcontroller 710, there is no need to conduct communication with an external computing device and microcontroller 710 can carry out all necessary method steps and interactions with PSoC 714 and power management unit 716.

After functioning battery detection logic 744 has determined the number of functioning batteries based on application of the modified method of flowchart 600 as described above, functioning battery determination logic 744 may operate to provide a user of electronic device 700 with an indication of the number of functioning batteries. For example, as discussed above, functioning battery detection logic 744 may present an indication of the number of functioning rechargeable batteries to a user of electronic device 700 via user interface 746.

In one embodiment, if functioning battery determination logic 744 determines that the number of functioning rechargeable batteries within electronic device 700 is less than the total number of rechargeable batteries, functioning battery determination logic 744 (or other logic invoked thereby) may perform operations that will reduce power consumption by electronic device 700 to at least partially compensate for the non-functioning battery. For example, functioning battery determination logic 744 may deactivate one or more device components or modify a manner of operation of one or more device components so that such component(s) consume less power. For example, in an embodiment in which device 700 includes a rotating motor for generating haptic feedback, functioning battery determination logic 744 may cause the duration and/or frequency of rotation of the motor to be reduced when producing haptic feedback so that the motor will consume less power. As another example, in an embodiment in which user interface 746 comprises a display, functioning battery determination logic 744 may cause a brightness of the display to be reduced so as to conserver battery power. However, these are only a few examples, and persons skilled in the relevant art(s) will appreciate that any of a wide variety of device components and operations may be modified to reduce power consumption in response to detecting that not all rechargeable batteries are operational.

Figure 8:
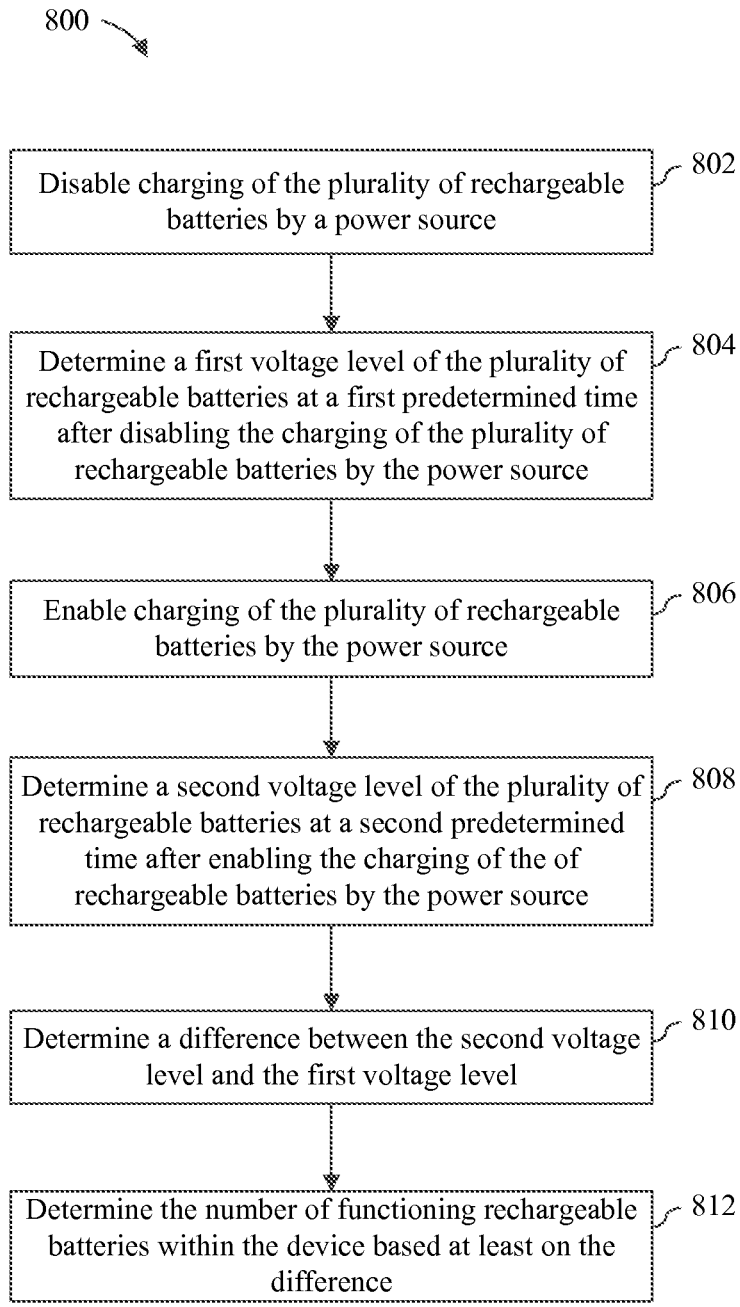
FIG. 8 depicts a flowchart of a method for automatically determining a number of functioning rechargeable batteries within a device that includes a plurality of rechargeable batteries.

As was previously noted, the method of flowchart 600 described above in reference to FIG. 6 may be generalized to operate with electronic devices that include different types and numbers of rechargeable batteries. To help illustrate this, FIG. 8 depicts a flowchart 800 of a more generalized method for automatically determining a number of functioning rechargeable batteries within a device that includes a plurality of rechargeable batteries in accordance with an embodiment. Although the method of flowchart 800 may be implemented by functioning battery detection logic 160 of FIG. 1 or functioning battery detection logic 744 of FIG. 7, the method is not limited to those embodiments and may in fact be used by any device that includes multiple rechargeable batteries.

As shown in FIG. 8, the method of flowchart 800 begins at step 802 in which charging of the plurality of rechargeable batteries by a power source is disabled. In the embodiment of flowchart 600, this step is implemented via step 604.

At step 804, a first voltage level of the plurality of rechargeable batteries is determined at a predetermined time after the disabling of the charging of the plurality of rechargeable batteries by the power source. In the embodiment of flowchart 600, this step is implemented via step 606.

At step 806, charging of the plurality of rechargeable batteries by the power source is enabled. In the embodiment of flowchart 600, this step is carried out as part of step 608.

At step 808, a second voltage level of the plurality of rechargeable batteries is determined at a predetermined time after the enabling of the charging of the plurality of rechargeable batteries by the power source. In the embodiment of flowchart 600, this step is implemented via step 610.

At step 810, a difference between the second voltage level and the first voltage level is determined. In the embodiment of flowchart 600, this difference is represented as the difference between the charge battery level and the discharge battery level and is calculated as a precursor to performing any of decision steps 624, 632 and 634.

At step 812, the number of functioning rechargeable batteries within the device is determined based at least on the difference determined during step 810. In an embodiment, this step maps the determined difference to a particular number of batteries based on expected difference values for certain numbers of batteries. In the embodiment of flowchart 600, this step is implemented via steps 622, 624, 626, 628, 630, 632, 634 and 636. Since expected difference values can be empirically determined for two, three, four or more rechargeable batteries, step 812 may be applied to determine the number of functioning batteries in any device that comprises two or more rechargeable batteries.

In certain embodiments, the method of flowchart 800 may be preceded by additional steps that are taken to ensure that the voltage level of the plurality of rechargeable batteries while charging is within a desired target range. For example, FIG. 9 depicts a flowchart 900 of method that may be performed prior to performing the steps of flowchart 800 to ensure that the voltage level of the plurality of rechargeable batteries while charging does not exceed a predetermined maximum voltage level.

Figure 9:
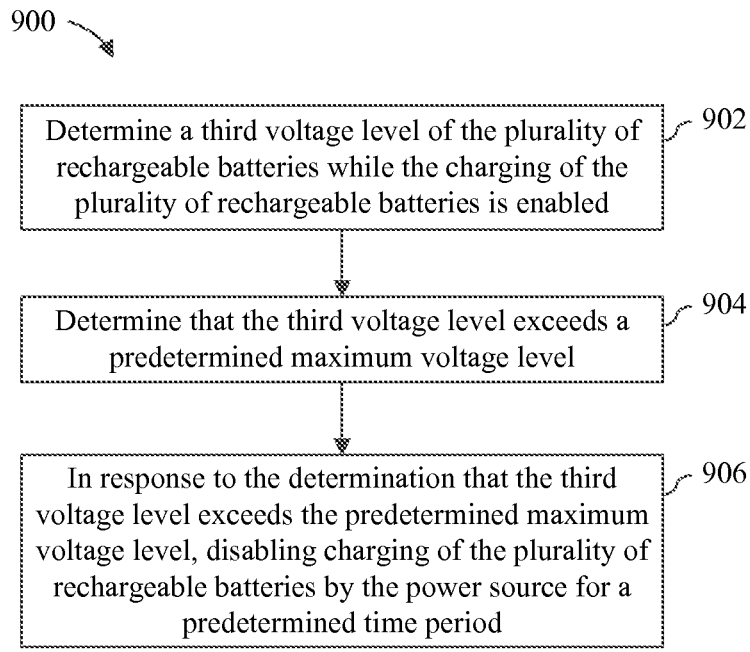
FIG. 9 depicts a flowchart of a method for ensuring that the voltage level associated with a plurality of rechargeable batteries while charging does not exceed a predetermined maximum voltage level prior to applying an algorithm thereto to determine how many of the plurality of rechargeable batteries are functioning.

As shown in FIG. 9, the method of flowchart 900 begins at step 902 in which a third voltage level of the plurality of rechargeable batteries is determined while the charging of the plurality of rechargeable batteries is enabled.

At step 904, it is determined that the third voltage level exceeds a predetermined maximum voltage level.

At step 906, in response to the determination that the third voltage level exceeds the predetermined maximum voltage level, the charging of the plurality of rechargeable batteries by the power source is disabled for a predetermined time period.

In the embodiment of flowchart 600, the steps of flowchart 900 are implemented via step 610, decision step 612, step 618, and step 620 which collectively operate to discharge the rechargeable batteries for two minutes when it is determined that the charge battery level exceeds 4200 mV.

Figure 10:
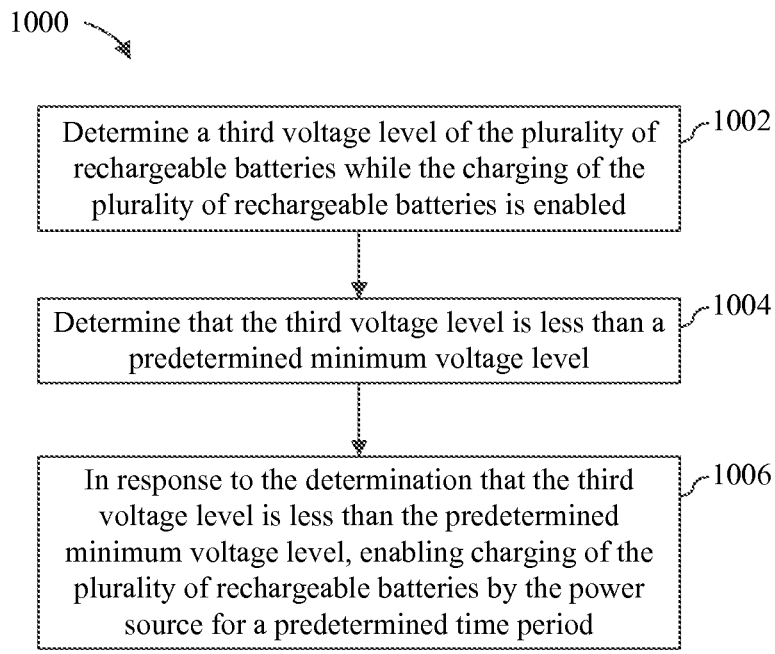
FIG. 10 depicts a flowchart of a method for ensuring that the voltage level associated with a plurality of rechargeable batteries while charging is not less than a predetermined minimum voltage level prior to applying an algorithm thereto to determine how many of the plurality of rechargeable batteries are functioning.

FIG. 10 depicts a flowchart 1000 of method that may be performed prior to performing the steps of flowchart 800 to ensure that the voltage level of the plurality of rechargeable batteries while charging is not less than a predetermined minimum voltage level.

As shown in FIG. 10, the method of flowchart 1000 begins at step 1002 in which a third voltage level of the plurality of rechargeable batteries is determined while the charging of the plurality of rechargeable batteries is enabled.

At step 1004, it is determined that the third voltage level is less than a predetermined minimum voltage level.

At step 1006, in response to the determination that the third voltage level is less than the predetermined minimum voltage level, the charging of the plurality of rechargeable batteries by the power source is enabled for a predetermined time period.

In the embodiment of flowchart 600, the steps of flowchart 1000 are implemented via step 610, decisions step 612 and 614, and step 616 which collectively operate to charge the rechargeable batteries for two minutes when it is determined that the charge battery level is less than 3900 mV.

FIG. 11 depicts a flowchart 1100 of a particular method for performing step 812 of flowchart 800. In particular, flowchart 1100 illustrates a method that may be used to determine the number of functioning rechargeable batteries within the device based at least on the difference between the second voltage level and the first voltage level computed during step 810 of flowchart 800.

As shown in FIG. 11, the method of flowchart 110 begins at step 1102, after which control flows to decision step 1104. At decision step 1104, it is determined whether the difference computed during step 810 is greater than a threshold voltage. If it is determined during decision step 1104 that the difference is not greater than the threshold voltage, then it is determined that the number of functioning rechargeable batteries is a first number as shown at step 1106. However, if it is determined during decision step 1104 that the difference is greater than the threshold voltage, then it is determined that the number of functioning rechargeable batteries is a second number as shown at step 1108. In an embodiment, the first number is smaller than the second number as a greater difference between the second voltage level and the first voltage level suggests a lower impedance and therefore fewer batteries.

In the embodiment of flowchart 600, the steps of flowchart 1000 are implemented by each of decision steps 624, 632 and 634 in combination with steps 626 and 636. In particular, each of decision steps 624, 632 and 634 compares the difference between the charge battery level and the discharge battery level to a particular threshold, while steps 626 and 636 determine different numbers of functioning rechargeable batteries based on the results of the comparison. The method of flowchart 600 further illustrates that the threshold voltage used during decision step 1104 may be selected based on the second voltage level.

FIG. 12 depicts flowchart of another generalized method for automatically determining a number of operational rechargeable batteries within a device that includes a plurality of rechargeable batteries. Like the method of flowchart 800, the method of flowchart 1200 may be implemented by functioning battery detection logic 160 of FIG. 1 or functioning battery detection logic 744 of FIG. 7. However, the method is not limited to those embodiments and may in fact be used by any device that includes multiple rechargeable batteries.

As shown in FIG. 12, the method of flowchart 1200 begins at step 1202 in which a first voltage level is obtained from a voltage level detector, the first voltage level being detected by the voltage level detector while the plurality of rechargeable batteries are in a discharging state. In the embodiment of flowchart 600, this step is implemented via step 606.

At step 1204, a second voltage level is obtained from the voltage level detector, the second voltage level being detected by the voltage level detector while the plurality of rechargeable batteries are in a charging state. In the embodiment of flowchart 600, this step is implemented via step 610.

At step 1206, a difference between the second voltage level and the first voltage level is determined. In the embodiment of flowchart 600, this difference is represented as the difference between the charge battery level and the discharge battery level and is calculated as a precursor to performing any of decision steps 624, 632 and 634.

At step 1208, the number of operational rechargeable batteries within the plurality of rechargeable batteries is determined based at least on the difference determined during step 1206. In an embodiment, this step maps the determined difference to a particular number of batteries based on expected difference values for certain numbers of batteries. In the embodiment of flowchart 600, this step is implemented via steps 622, 624, 626, 628, 630, 632, 634 and 636.

In certain embodiments, additional steps may be taken based on a determination that not all of the rechargeable batteries within the device are operational. For example, FIG. 13 depicts a flowchart 1300 of a method for responding to a determination that not all of the rechargeable batteries within the electronic device are functioning. As shown in FIG. 13, the method of flowchart 1300 begins at step 1302, in which a determination is made that the number of operational rechargeable batteries is less than the total number of rechargeable batteries in the device. At step 1304, in response to this determination, a user-perceptible indication that the number of operational batteries is less than the total number of rechargeable batteries in the device is generated. The user-perceptible indication may be provided via a user interface of the device itself, via a user interface of a computing device connected thereto, or via some other means (e.g., sending a message to another device owned by or otherwise accessible to the user).

As another example, FIG. 14 depicts a flowchart 1400 of another method for responding to a determination that not all of the rechargeable batteries within the electronic device are functioning. As shown in FIG. 14, the method of flowchart 1400 begins at step 1402, in which a determination is made that the number of operational rechargeable batteries is less than the total number of rechargeable batteries in the device. At step 1404, in response to this determination, a battery power consumption level of at least one component of the electronic device is reduced. For example, the battery power consumption level of a particular component may be reduced by deactivating the component or modifying a manner of operation of the component so that the component consumes less power. As was previously discussed, particular examples of this include but are by no means limited to reducing the duration and/or frequency of a rotating motor used for generating haptic feedback and reducing the brightness of a display.

FIG. 15 depicts a flowchart 1500 of another generalized method for automatically determining a number of operational rechargeable batteries within a device that includes a plurality of rechargeable batteries. Like the methods of flowcharts 700 and 800, the method of flowchart 1500 may be implemented by functioning battery detection logic 160 of FIG. 1 or functioning battery detection logic 744 of FIG. 7. However, the method is not limited to those embodiments and may in fact be used by any device that includes multiple rechargeable batteries.

As shown in FIG. 15, the method of flowchart 1500 begins at step 1502, in which is determined a measure of impedance associated with a plurality of rechargeable batteries within an electronic device based on a first voltage level of the plurality of rechargeable batteries obtained during a discharging state and a second voltage level of the plurality of rechargeable batteries obtained during a charging state. In the embodiment of flowchart 600 in which a fixed charging current is utilized, this step is implemented by determining the difference between the charge battery level and the discharge battery level. However, it is to be understood that a variety of other methods may be used to determine the measure of impedance associated with the plurality of rechargeable batteries.

At step 1504, a number of operational rechargeable batteries within the plurality of rechargeable batteries based on the measure of impedance determined during step 1502. In the embodiment of flowchart 600, this step is implemented by comparing the difference between the charge battery level and the discharge battery level to the different thresholds to determine whether one battery or two batteries are operational within the electronic device.

III. Example Computer System Implementation

FIG. 16 depicts an example processor-based computer system 1600 that may be used to implement various embodiments described herein. For example, system 1600 may be used to implement computing device 104 as described above in reference to FIG. 1. System 1600 may also be used to implement any or all of the steps of any or all of the flowcharts depicted in FIGS. 6 and 8-15. The description of system 1600 provided herein is provided for purposes of illustration, and is not intended to be limiting. Embodiments may be implemented in further types of computer systems, as would be known to persons skilled in the relevant art(s).

As shown in FIG. 16, system 1600 includes a processing unit 1602, a system memory 1604, and a bus 1606 that couples various system components including system memory 1604 to processing unit 1602. Processing unit 1602 may comprise one or more microprocessors or microprocessor cores. Bus 1606 represents one or more of any of several types of bus structures, including a memory bus or memory controller, a peripheral bus, an accelerated graphics port, and a processor or local bus using any of a variety of bus architectures. System memory 1604 includes read only memory (ROM) 1608 and random access memory (RAM) 1610. A basic input/output system 1612 (BIOS) is stored in ROM 1608.

System 1600 also has one or more of the following drives: a hard disk drive 1614 for reading from and writing to a hard disk, a magnetic disk drive 1616 for reading from or writing to a removable magnetic disk 1618, and an optical disk drive 1620 for reading from or writing to a removable optical disk 1622 such as a CD ROM, DVD ROM, BLU-RAY™ disk or other optical media. Hard disk drive 1614, magnetic disk drive 1616, and optical disk drive 1620 are connected to bus 1606 by a hard disk drive interface 1624, a magnetic disk drive interface 1626, and an optical drive interface 1628, respectively. The drives and their associated computer-readable media provide nonvolatile storage of computer-readable instructions, data structures, program modules and other data for the computer. Although a hard disk, a removable magnetic disk and a removable optical disk are described, other types of computer-readable memory devices and storage structures can be used to store data, such as flash memory cards, digital video disks, random access memories (RAMs), read only memories (ROM), and the like.

A number of program modules may be stored on the hard disk, magnetic disk, optical disk, ROM, or RAM. These program modules include an operating system 1630, one or more application programs 1632, other program modules 1634, and program data 1636. In accordance with various embodiments, the program modules may include computer program logic that is executable by processing unit 1602 to perform any or all of the functions and features of computing device 104 as described above in reference to FIG. 1. The program modules may also include computer program logic that, when executed by processing unit 1602, performs any of the steps or operations shown or described in reference to the flowcharts of FIGS. 6 and 8-15.

A user may enter commands and information into system 1600 through input devices such as a keyboard 1638 and a pointing device 1640 (e.g., a mouse). Other input devices (not shown) may include a microphone, joystick, game controller, scanner, or the like. In one embodiment, a touch screen is provided in conjunction with a display 1644 to allow a user to provide user input via the application of a touch (as by a finger or stylus for example) to one or more points on the touch screen. These and other input devices are often connected to processing unit 1602 through a serial port interface 1642 that is coupled to bus 1606, but may be connected by other interfaces, such as a parallel port, game port, or a universal serial bus (USB). Such interfaces may be wired or wireless interfaces.

Display 1644 is connected to bus 1606 via an interface, such as a video adapter 1646. In addition to display 1644, system 1600 may include other peripheral output devices (not shown) such as speakers and printers.

System 1600 is connected to a network 1648 (e.g., a local area network or wide area network such as the Internet) through a network interface 1650, a modem 1652, or other suitable means for establishing communications over the network. Modem 1652, which may be internal or external, is connected to bus 1606 via serial port interface 1642.

As used herein, the terms "computer program medium," "computer-readable medium," and "computer-readable storage medium" are used to generally refer to memory devices or storage structures such as the hard disk associated with hard disk drive 1614, removable magnetic disk 1618, removable optical disk 1622, as well as other memory devices or storage structures such as flash memory cards, digital video disks, random access memories (RAMs), read only memories (ROM), and the like. Such computer-readable storage media are distinguished from and non-overlapping with communication media (do not include communication media). Communication media typically embodies computer-readable instructions, data structures, program modules or other data in a modulated data signal such as a carrier wave. The term "modulated data signal" means a signal that has one or more of its characteristics set or changed in such a manner as to encode information in the signal. By way of example, and not limitation, communication media includes wireless media such as acoustic, RF, infrared and other wireless media. Embodiments are also directed to such communication media.

As noted above, computer programs and modules (including application programs 1632 and other program modules 1634) may be stored on the hard disk, magnetic disk, optical disk, ROM, or RAM. Such computer programs may also be received via network interface 1650, serial port interface 1642, or any other interface type. Such computer programs, when executed or loaded by an application, enable system 1600 to implement features of embodiments discussed herein. Accordingly, such computer programs represent controllers of the system 1600.

Embodiments are also directed to computer program products comprising software stored on any computer useable medium. Such software, when executed in one or more data processing devices, causes a data processing device(s) to operate as described herein. Embodiments may employ any computer-useable or computer-readable medium, known now or in the future. Examples of computer-readable mediums include, but are not limited to memory devices and storage structures such as RAM, hard drives, floppy disks, CD ROMs, DVD ROMs, zip disks, tapes, magnetic storage devices, optical storage devices, MEMs, nanotechnology-based storage devices, and the like.

IV. Additional Exemplary Embodiments

A method for automatically determining a number of functioning rechargeable batteries within a device that includes a plurality of rechargeable batteries is described herein. The method includes: disabling charging of the plurality of rechargeable batteries by a power source; determining a first voltage level of the plurality of rechargeable batteries at a first predetermined time after disabling the charging of the plurality of rechargeable batteries by the power source; enabling charging of the plurality of rechargeable batteries by the power source; determining a second voltage level of the plurality of rechargeable batteries at a second predetermined time after enabling the charging of the plurality of rechargeable batteries by the power source; determining a difference between the second voltage level and the first voltage level; and determining the number of functioning rechargeable batteries within the device based at least on the difference.

In one embodiment of the foregoing method, one or more of the steps are performed by firmware executing on a processor internal to the device.

In another embodiment of the foregoing method, one or more of the steps are performed by software executing on a computer that is external to the device and connected thereto.

In yet another embodiment of the foregoing method, the power source comprises a power source that is external to the device and connected thereto.

In still another embodiment of the foregoing method, determining the number of functioning rechargeable batteries within the device based at least on the difference comprises: determining that the second voltage level is within a predetermined range of voltage levels; and in response to determining that the second voltage level is within the predetermined range of voltage levels, determining the number of functioning rechargeable batteries within the device based at least on the difference.

In a further embodiment of the foregoing method, the predetermined range of voltage levels substantially corresponds to forty percent to sixty percent of a maximum voltage level of the plurality of rechargeable batteries.

In a still further embodiment of the foregoing method, the method further comprises, prior to performing the disabling step: determining a third voltage level of the plurality of rechargeable batteries while the charging of the plurality of rechargeable batteries by the power source is enabled; determining that the third voltage level exceeds a predetermined maximum voltage level; and in response to determining that the third voltage level exceeds the predetermined maximum voltage level, disabling charging of the plurality of rechargeable batteries by the power source for a predetermined time period.

In another embodiment of the foregoing method, the method further comprises, prior to performing the disabling step: determining a third voltage level of the plurality of rechargeable batteries while the charging of the plurality of rechargeable batteries by the power source is enabled; determining that the third voltage level is less than a predetermined minimum voltage level; and in response to determining that the third voltage level is less than the predetermined minimum voltage level, enabling charging of the plurality of rechargeable batteries by the power source for a predetermined time period.

In yet another embodiment of the foregoing method, determining the number of functioning rechargeable batteries within the device based at least on the difference comprises: determining if the difference exceeds a threshold voltage; determining that the number of functioning rechargeable batteries is a first number in response to determining that the difference exceeds the threshold voltage; and determining that the number of functioning rechargeable batteries is a second number in response to determining that the difference does not exceed the threshold voltage. In further accordance with this embodiment, the method may further include selecting the threshold voltage based on the second voltage level.

An apparatus is described herein. The apparatus includes: a plurality of rechargeable batteries; a voltage level detector operable to detect a voltage level associated with the plurality of rechargeable batteries; one or more memory devices that store computer program logic; and one or more processors connected to the voltage level detector and the one or more memory devices, the one or more processors being operable to perform operations by executing the computer program logic. The operations include: obtaining from the voltage level detector a first voltage level detected while the plurality of rechargeable batteries are in a discharging state; obtaining from the voltage level detector a second voltage level detected while the plurality of rechargeable batteries are in a charging state; determining a difference between the second voltage level and the first voltage level; and determining a number of operational rechargeable batteries within the plurality of rechargeable batteries based at least on the difference.

In one embodiment of the foregoing apparatus, the apparatus comprises one of a smart phone, a tablet computer, a personal media player, a camera, a handheld video game console, a video game controller, a wearable device or an Internet of Things device.

In another embodiment of the foregoing apparatus, the apparatus further comprises a power management unit connected to the plurality of rechargeable batteries and operable to enable or disable charging of the plurality of rechargeable batteries by a power source. In further accordance with such an embodiment, the first voltage level is detected at a first predetermined time after the power management unit disables the charging of the plurality of rechargeable batteries by the power source and the second voltage level is detected at a second predetermined time after the power management unit enables the charging of the plurality of rechargeable batteries by the power source.

In yet another embodiment of the foregoing apparatus, determining the number of operational rechargeable batteries within the plurality of rechargeable batteries based at least on the difference comprises determining that the second voltage level is within a predetermined range of voltage levels, and, in response to determining that the second voltage level is within the predetermined range of voltage levels, determining the number of operational rechargeable batteries within the plurality of rechargeable batteries based at least on the difference.

In still another embodiment of the foregoing apparatus, the predetermined range of voltage levels substantially corresponds to forty percent to sixty percent of the maximum voltage level of the plurality of rechargeable batteries.

In a further embodiment of the foregoing apparatus, determining the number of operational rechargeable batteries within the plurality of rechargeable batteries based at least on the difference comprises: determining if the difference exceeds a threshold voltage; determining that the number of operational rechargeable batteries is a first number in response to determining that the difference exceeds the threshold voltage; and determining that the number of operable rechargeable batteries is a second number in response to determining that the difference does not exceed the threshold voltage. In further accordance with such an embodiment, the operations may further comprise selecting the threshold voltage based on the second voltage level.

In a still further embodiment of the foregoing apparatus, the operations further comprise: in response to determining that the number of operational rechargeable batteries is less than the total number of rechargeable batteries in the plurality of rechargeable batteries, reducing a battery power consumption level of at least one component of the apparatus.

In another embodiment of the foregoing apparatus, the operations further comprise: in response to determining that the number of operational rechargeable batteries is less than the total number of rechargeable batteries in the plurality of rechargeable batteries, generating a user-perceptible indication that the number of operational rechargeable batteries is less than the total number of rechargeable batteries in the plurality of rechargeable batteries.

A computer program product is described herein. The computer program product comprises a computer-readable memory having computer program logic recorded thereon that when executed by at least one processor causes the at least one processor to perform a method that includes: determining a measure of impedance associated with a plurality of rechargeable batteries within an electronic device based on a first voltage level of the plurality of rechargeable batteries obtained during a discharging state and a second voltage level of the plurality of rechargeable batteries obtained during a charging state; and determining a number of operational rechargeable batteries within the plurality of rechargeable batteries based on the measure of impedance.

V. CONCLUSION

While various embodiments have been described above, it should be understood that they have been presented by way of example only, and not limitation. It will be apparent to persons skilled in the relevant art(s) that various changes in form and details can be made therein without departing from the spirit and scope of the invention as defined in the appended claims. Thus, the breadth and scope of the present invention should not be limited by any of the above-described exemplary embodiments, but should be defined only in accordance with the following claims and their equivalents.

What is claimed is:

1. A method for automatically determining a number of functioning rechargeable batteries within a device that includes a plurality of rechargeable batteries, comprising:
   disabling charging of the plurality of rechargeable batteries by a power source;
   determining a first voltage level of the plurality of rechargeable batteries at a first predetermined time after disabling the charging of the plurality of rechargeable batteries by the power source;
   subsequent to the determining the first voltage level, enabling charging of the plurality of rechargeable batteries by the power source;
   determining a second voltage level of the plurality of rechargeable batteries at a second predetermined time after enabling the charging of the plurality of rechargeable batteries by the power source;
   determining a difference between the second voltage level and the first voltage level; and
   determining the number of functioning rechargeable batteries within the device based at least on the difference.

2. The method of claim 1, wherein one or more of the steps are performed by firmware executing on a processor internal to the device.

3. The method of claim 1, wherein one or more of the steps are performed by software executing on a computer that is external to the device and connected thereto.

4. The method of claim 1, wherein the power source comprises a power source that is external to the device and connected thereto.

5. The method of claim 1, wherein determining the number of functioning rechargeable batteries within the device based at least on the difference comprises:
   determining that the second voltage level is within a predetermined range of voltage levels; and
   in response to determining that the second voltage level is within the predetermined range of voltage levels, determining the number of functioning rechargeable batteries within the device based at least on the difference.

6. The method of claim 5, wherein the predetermined range of voltage levels substantially corresponds to forty percent to sixty percent of a maximum voltage level of the plurality of rechargeable batteries.

7. The method of claim 1, further comprising, prior to performing the disabling step:
   determining a third voltage level of the plurality of rechargeable batteries while the charging of the plurality of rechargeable batteries by the power source is enabled;
   determining that the third voltage level exceeds a predetermined maximum voltage level; and
   in response to determining that the third voltage level exceeds the predetermined maximum voltage level, disabling charging of the plurality of rechargeable batteries by the power source for a predetermined time period.

8. The method of claim 1, further comprising, prior to performing the disabling step:
   determining a third voltage level of the plurality of rechargeable batteries while the charging of the plurality of rechargeable batteries by the power source is enabled;
   determining that the third voltage level is less than a predetermined minimum voltage level; and
   in response to determining that the third voltage level is less than the predetermined minimum voltage level, enabling charging of the plurality of rechargeable batteries by the power source for a predetermined time period.

9. The method of claim 1, wherein determining the number of functioning rechargeable batteries within the device based at least on the difference comprises:
   determining if the difference exceeds a threshold voltage;
   determining that the number of functioning rechargeable batteries is a first number in response to determining that the difference exceeds the threshold voltage; and
   determining that the number of functioning rechargeable batteries is a second number in response to determining that the difference does not exceed the threshold voltage.

10. The method of claim 9, further comprising:
    selecting the threshold voltage based on the second voltage level.

11. An apparatus, comprising:
    a plurality of rechargeable batteries;
    a voltage level detector operable to detect a voltage level associated with the plurality of rechargeable batteries;
    one or more memory devices that store computer program logic; and
    one or more processors connected to the voltage level detector and the one or more memory devices, the one or more processors being operable to perform operations by executing the computer program logic, the operations including:
      obtaining from the voltage level detector a first voltage level detected while the plurality of rechargeable batteries are in a discharging state;
      subsequent to the obtaining the first voltage level, obtaining from the voltage level detector a second voltage level detected while the plurality of rechargeable batteries are in a charging state;
      determining a difference between the second voltage level and the first voltage level; and
      determining a number of operational rechargeable batteries within the plurality of rechargeable batteries based at least on the difference.

12. The apparatus of claim 11, wherein the apparatus comprises one of a smart phone, a tablet computer, a personal media player, a camera, a handheld video game console, a video game controller, a wearable device or an Internet of Things device.

13. The apparatus of claim 11, further comprising:
    a power management unit connected to the plurality of rechargeable batteries and operable to enable or disable charging of the plurality of rechargeable batteries by a power source;
    wherein the first voltage level is detected at a first predetermined time after the power management unit disables the charging of the plurality of rechargeable batteries by the power source; and
    wherein the second voltage level is detected at a second predetermined time after the power management unit enables the charging of the plurality of rechargeable batteries by the power source.

14. The apparatus of claim 11, wherein determining the number of operational rechargeable batteries within the plurality of rechargeable batteries based at least on the difference comprises determining that the second voltage level is within a predetermined range of voltage levels, and, in response to determining that the second voltage level is within the predetermined range of voltage levels, determining the number of operational rechargeable batteries within the plurality of rechargeable batteries based at least on the difference.

15. The apparatus of claim 14, wherein the predetermined range of voltage levels substantially corresponds to forty percent to sixty percent of the maximum voltage level of the plurality of rechargeable batteries.

16. The apparatus of claim 11, wherein determining the number of operational rechargeable batteries within the plurality of rechargeable batteries based at least on the difference comprises:
    determining if the difference exceeds a threshold voltage;
    determining that the number of operational rechargeable batteries is a first number in response to determining that the difference exceeds the threshold voltage; and
    determining that the number of operable rechargeable batteries is a second number in response to determining that the difference does not exceed the threshold voltage.

17. The apparatus of claim 16, wherein the operations further comprise:
    selecting the threshold voltage based on the second voltage level.

18. The apparatus of claim 11, wherein the operations further comprise:
    in response to determining that the number of operational rechargeable batteries is less than the total number of rechargeable batteries in the plurality of rechargeable batteries, reducing a battery power consumption level of at least one component of the apparatus.

19. The apparatus of claim 11, wherein the operations further comprise:
    in response to determining that the number of operational rechargeable batteries is less than the total number of rechargeable batteries in the plurality of rechargeable batteries, generating a user-perceptible indication that the number of operational rechargeable batteries is less than the total number of rechargeable batteries in the plurality of rechargeable batteries.

20. A computer program product comprising a computer-readable memory device having computer program logic recorded thereon that when executed by at least one processor causes the at least one processor to perform a method comprising:

placing a plurality of rechargeable batteries within an electronic device in a discharging state to obtain a first voltage level of the plurality of rechargeable batteries;

subsequent to the obtaining the first voltage level, placing the plurality of rechargeable batteries in a charging state to obtain a second voltage level of the plurality of rechargeable batteries;

determining a measure of impedance associated with the plurality of rechargeable batteries based on the first voltage level and the second voltage level; and determining a number of operational rechargeable batteries within the plurality of rechargeable batteries based on the measure of impedance.

* * * * *